(12) United States Patent
Lee et al.

(10) Patent No.: US 7,511,300 B2
(45) Date of Patent: Mar. 31, 2009

(54) ARRAY SUBSTRATE, DISPLAY DEVICE HAVING THE SAME AND METHOD OF MANUFACTURING THE SAME

(75) Inventors: Je-Hun Lee, Seoul (KR); Do-Hyun Kim, Seoul (KR); Eun-Guk Lee, Yongin-si (KR); Chang-Oh Jeong, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 8 days.

(21) Appl. No.: 11/779,534

(22) Filed: Jul. 18, 2007

(65) Prior Publication Data

US 2008/0017862 A1    Jan. 24, 2008

(30) Foreign Application Priority Data

Jul. 20, 2006    (KR) ...................... 10-2006-0067979

(51) Int. Cl.
*H01L 33/00* (2006.01)
(52) U.S. Cl. .............................. 257/59; 257/72; 257/88; 257/291; 257/E33.063
(58) Field of Classification Search .................. 257/59, 257/72, 88, 291, E33.063
See application file for complete search history.

(56) References Cited

U.S. PATENT DOCUMENTS

| 6,255,706 | B1 | 7/2001 | Watanabe et al. | |
|---|---|---|---|---|
| 7,289,183 | B2 * | 10/2007 | Gan et al. | 349/147 |
| 2005/0062046 | A1 | 3/2005 | Kim et al. | |
| 2006/0110866 | A1 | 5/2006 | Gan et al. | |
| 2006/0292888 | A1 * | 12/2006 | Park et al. | 438/754 |
| 2007/0013077 | A1 * | 1/2007 | Lee et al. | 257/762 |
| 2007/0013078 | A1 * | 1/2007 | Lee et al. | 257/762 |

FOREIGN PATENT DOCUMENTS

| EP | 1610389 | 12/2005 |
|---|---|---|
| JP | 2000-208773 | 7/2000 |
| KR | 10-2000-0056517 | 9/2000 |

OTHER PUBLICATIONS

European Search Report dated Sep. 12, 2007.

* cited by examiner

*Primary Examiner*—Victor A Mandala
(74) *Attorney, Agent, or Firm*—H.C. Park & Associates, PLC

(57) ABSTRACT

An array substrate includes a switching element, a signal transmission line, a passivation layer and a pixel electrode. The switching element is disposed on an insulating substrate. The signal transmission line is connected to the switching element and includes a barrier layer, a conductive line, and a copper nitride layer. The barrier layer is disposed on the insulating substrate. The conductive line is disposed on the barrier layer and includes copper or copper alloy. The copper nitride layer covers the conductive line. The passivation layer covers the switching element and the signal transmission line and has a contact hole through which a drain electrode of the switching element is partially exposed. The pixel electrode is disposed on the insulating substrate, and is connected to the drain electrode of the switching element through the contact hole.

11 Claims, 26 Drawing Sheets

ARRAY SUBSTRATE, DISPLAY DEVICE HAVING THE SAME AND METHOD OF MANUFACTURING THE SAME

CROSS-REFERENCE TO RELATED APPLICATIONS

The present application claims priority from and the benefit of Korean Patent Application No. 2006-67979, filed on Jul. 20, 2006, the disclosure of which is hereby incorporated by reference for all purposes as if fully set forth herein.

BACKGROUND OF THE INVENTION

1 Field of the Invention

The present invention relates to an array substrate, a display device including the array substrate, and a method of manufacturing the array substrate. More particularly, the present invention relates to an array substrate capable of decreasing line resistance and the occurrence of line defects, a display device including the array substrate, and a simplified method of manufacturing the array substrate.

2 Discussion of the Background

An array substrate of a flat panel display device includes various lines for transmitting signals, which are formed through thin film deposition processes.

In the flat panel display device, the length of the lines has been increased, and the thickness of the lines has been decreased, thereby increasing the resistance of the lines.

In addition, the lines chemically react with an insulating substrate, an insulating layer, oxygen, etc., so that the resistance of the lines is greatly increased. Therefore, the image display quality is deteriorated.

Furthermore, when a metal layer is etched to form the lines, the etching uniformity of the metal layer may be deteriorated, which may deteriorate the etching profile of the lines.

SUMMARY OF THE INVENTION

The present invention provides an array substrate capable of decreasing line resistance and the occurrence of line defects.

The present invention also provides a display device including the above mentioned array substrate.

The present invention also provides a simplified method of manufacturing the array substrate.

The present invention discloses an array substrate including a switching element, a signal transmission line, a passivation layer, and a pixel electrode. The switching element is on an insulating substrate. The signal transmission line is connected to the switching element and includes a barrier layer, a conductive line, and a copper nitride layer. The barrier layer is on the insulating substrate. The conductive line is on the barrier layer and includes copper or copper alloy. The copper nitride layer covers the conductive line. The passivation layer covers the switching element and the signal transmission line and includes a contact hole through which a drain electrode of the switching element is partially exposed. The pixel electrode is on the insulating substrate and connected to the drain electrode of the switching element through the contact hole.

The present invention also discloses a display device including a switching element, a signal transmitting line, a pixel electrode, a passivation layer, a liquid crystal layer, an opposite electrode, and an opposite insulating substrate. The switching element is on an insulating substrate. The signal transmitting line is connected to the switching element. The signal transmitting line includes a barrier layer, a conductive line, and a copper nitride layer. The barrier layer is on the insulating substrate. The conductive line is on the barrier layer and includes copper or copper alloy. The copper nitride layer covers the conductive line. The pixel electrode is on the insulating substrate and is connected to a drain electrode of the switching element. The passivation layer covers the switching element and the signal transmission line. The liquid crystal layer is on the passivation layer. The opposite electrode is on the liquid crystal layer and faces the pixel electrode. The opposite insulating substrate is on the opposite electrode and faces the insulating substrate.

The present invention also discloses a method of manufacturing an array substrate that is provided as follows. A barrier layer is formed on an insulating substrate. A gate line and a gate electrode are formed on the barrier layer. The gate line includes copper or copper alloy and the gate electrode is connected to the gate line. Nitride plasma is applied to the gate line and the gate electrode. A gate insulating layer is deposited on the insulating substrate to cover the gate line and the gate electrode. A data line, a source electrode connected to the data line, a drain electrode spaced apart from the source electrode, and a semiconductor pattern are formed on the gate insulating layer. The source electrode is connected to the data line and the drain electrode is spaced apart from the source electrode. The semiconductor pattern is on the gate electrode between the source electrode and the drain electrode.

The present invention discloses another method of manufacturing an array substrate that is provided as follows. A gate line, a gate electrode, and a gate insulating layer are formed on an insulating substrate. The gate electrode is connected to the gate line. The gate insulating layer covers the gate line and the gate electrode. A semiconductor pattern is formed on the gate insulating layer corresponding to the gate electrode. A data line, a source electrode, and a drain electrode are formed on the gate insulating layer. The data line includes copper or copper alloy. The source electrode is connected to the data line. The drain electrode is spaced apart from the source electrode with respect to the semiconductor pattern. Nitride plasma is applied to the data line, the source electrode, and the drain electrode. A passivation layer is deposited on the gate insulating layer to cover the semiconductor pattern, the data line, the source electrode, and the drain electrode.

The present invention discloses still another method of manufacturing an array substrate that is provided as follows. A first barrier layer, a first conductive layer, and a first copper nitride layer are deposited on an insulating substrate, in sequence. The first conductive layer includes copper or copper alloy. The first barrier layer, the first conductive layer, and the first copper nitride layer are patterned to form a gate line and a gate electrode connected to the gate line. A gate insulating layer is deposited on the insulating substrate to cover the gate line and the gate electrode. A data line, a source electrode, a drain electrode, and a semiconductor pattern are formed on the gate insulating layer. The source electrode is connected to the data line and the drain electrode is spaced apart from the source electrode. The semiconductor pattern is on the gate electrode between the source electrode and the drain electrode.

The present invention discloses yet another method of manufacturing an array substrate that is provided as follows. A barrier layer is formed on an insulating substrate. A gate line and a gate electrode are formed on the barrier layer. The gate line includes copper or copper alloy and the gate electrode is connected to the gate line. Hydrogen plasma is applied to the gate line and the gate electrode. A first gas mixture is injected into a chamber to form a first gate insulating layer on the insulating substrate. The first gas mixture includes silane gas, nitrogen gas, and ammonia gas. The amount of silane gas in the first gas mixture is no more than about 6.43% by volume. A second gas mixture is injected into the chamber to form a second gate insulating layer on the insulating substrate. The second gas mixture includes silane gas, nitrogen gas, and ammonia gas. The amount of silane gas in the second gas mixture is no less than about 6.43% by volume. A third gas mixture is injected into the chamber to form a third gate insulating layer on the insulating substrate. The third gas mixture includes silane gas, nitrogen gas, and ammonia gas. The amount of silane gas in the third gas mixture is no more than about 6.43% by volume. A data line, a source electrode, a drain electrode, and a semiconductor pattern are formed on the third gate insulating layer. The source electrode is connected to the data line and the drain electrode is spaced apart from the source electrode. The semiconductor pattern is on the gate electrode between the source electrode and the drain electrode.

It is to be understood that both the foregoing and general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the principles of the invention.

DETAILED DESCRIPTION OF THE ILLUSTRATED EMBODIMENTS

Figure 1:
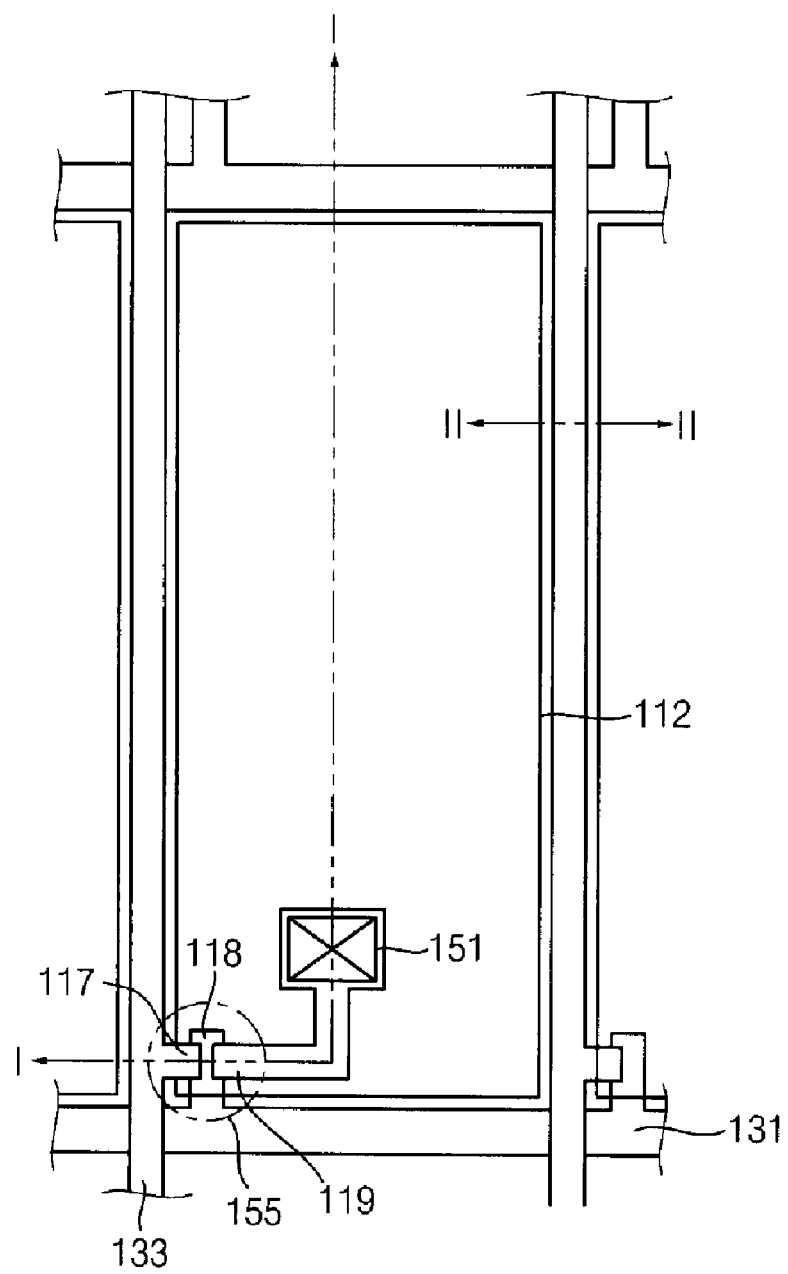
FIG. 1 is a plan view showing an array substrate in accordance with one exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to" or "coupled to" another element or layer, it can be directly on, directly connected to, or directly coupled to the other element or layer, or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be described in detail with reference to the accompanying drawings.

Figure 2:
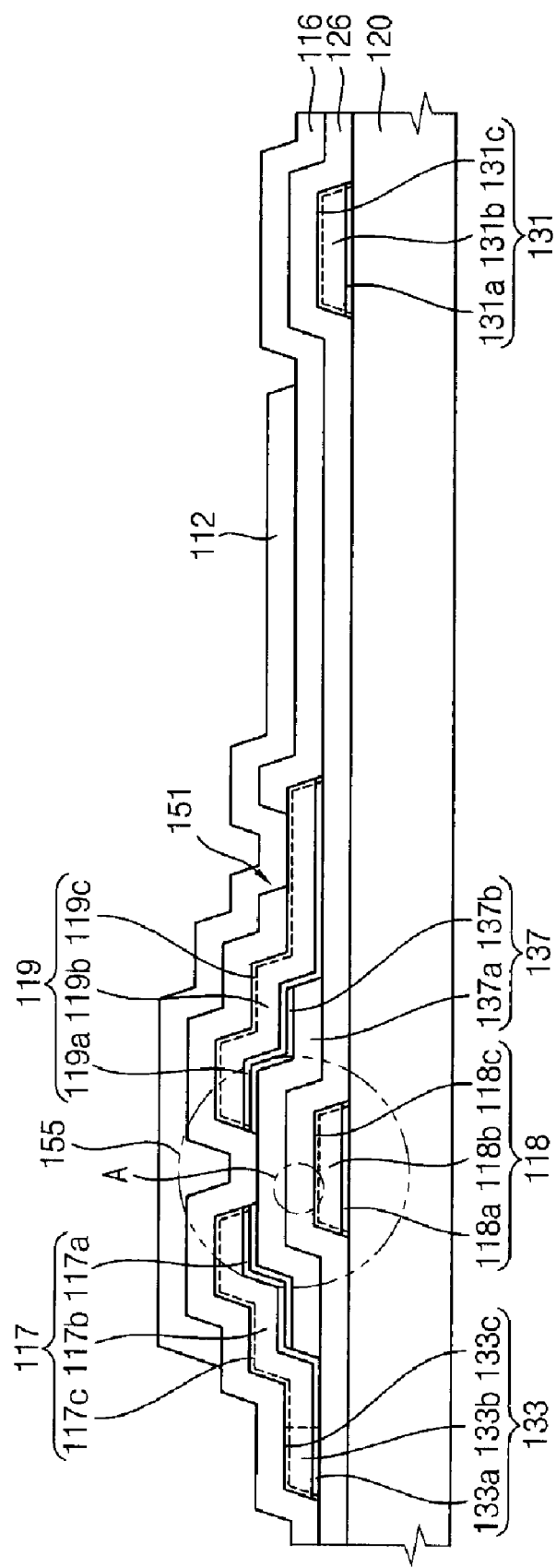
FIG. 2 is a cross-sectional view taken along line I-I' of FIG. 1.
Figure 3:
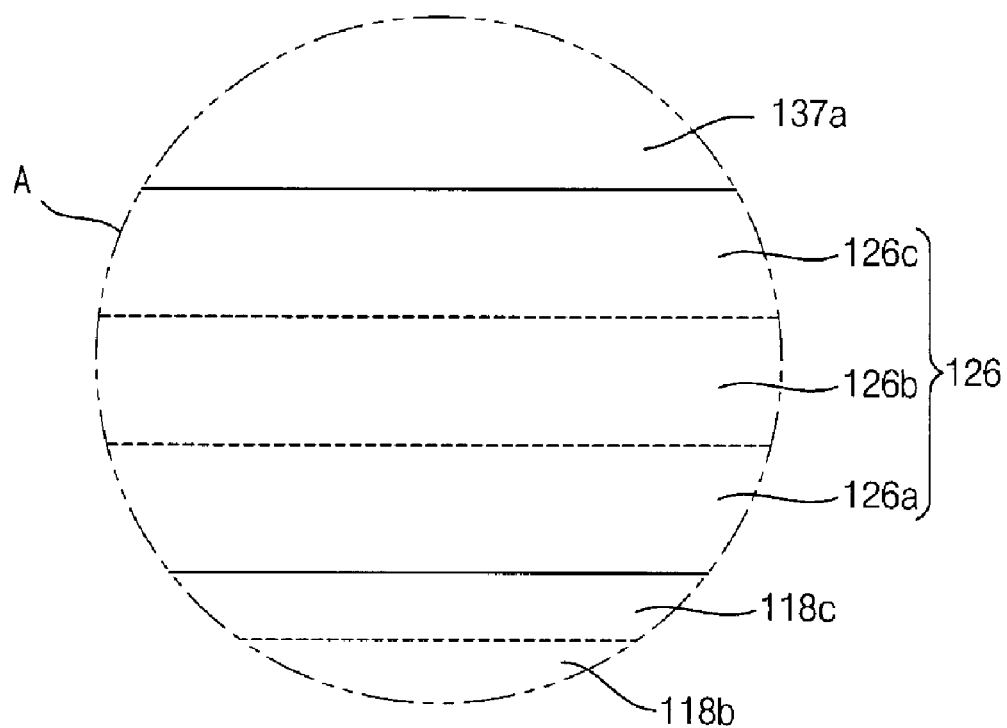
FIG. 3 is an enlarged cross-sectional view showing portion 'A' of FIG. 2.
Figure 4:
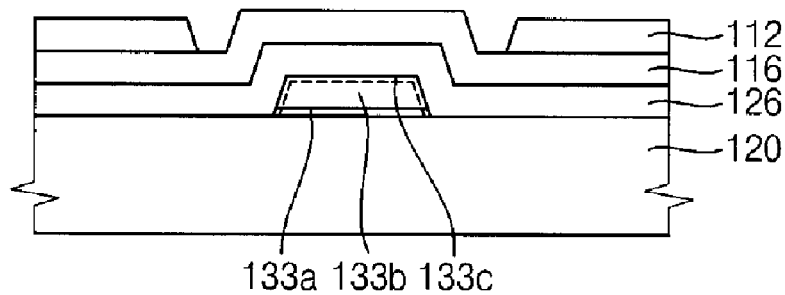
FIG. 4 is a cross-sectional view taken along line II-II' of FIG. 1.

FIG. 1 is a plan view showing an array substrate in accordance with one exemplary embodiment of the present invention. FIG. 2 is a cross-sectional view taken along line I-I' of FIG. 1. FIG. 3 is an enlarged cross-sectional view showing portion 'A' of FIG. 2. FIG. 4 is a cross-sectional view taken along line II-II' of FIG. 1.

Referring to FIG. 1, FIG. 2, and FIG. 4, the array substrate includes an insulating substrate 120, a gate line 131, a data line 133, a gate insulating layer 126, a passivation layer 116, and a pixel electrode 112. Alternatively, the array substrate may include a plurality of gate lines, a plurality of data lines, and a plurality of pixel electrodes.

The insulating substrate 120 may include a transparent glass that transmits light. The insulating substrate 120 may not include alkaline ions. When the insulating substrate 120 includes alkaline ions, the alkaline ions may be dissolved in a liquid crystal layer (not shown) and may decrease the resistance of the liquid crystal layer, which may decrease the image display quality and the adhesive strength between a sealant (not shown) and the insulating substrate 120. In addition, characteristics of a thin film transistor may be deteriorated.

The insulating substrate 120 may also include a high polymer that is optically transparent. Examples of optically transparent high polymers that may be included in the insulating substrate 120 include triacetylcellulose (TAC), polycarbonate (PC), polyethersulfone (PES), polyethyleneterephthalate (PET), polyethylenenaphthalate (PEN), polyvinylalcohol (PVA), polymethylmethacrylate (PMMA), cyclo-olefin polymer (COP), and combinations thereof.

The insulating substrate 120 may be optically isotropic. Alternatively, the insulating substrate 120 may be optically anisotropic.

The gate line 131 is disposed on the insulating substrate 120. The gate line 131 includes a gate barrier layer 131a, a gate conductive layer 131b, and a gate copper nitride layer 131c.

The gate barrier layer 131a is disposed on the insulating substrate 120. The gate barrier layer 131a increases the adhesive strength between the gate line 131 and the insulating substrate 120. Examples of barrier material that may be used in the gate barrier layer 131a include molybdenum (Mo), molybdenum-titanium (Mo—Ti) alloy, molybdenum-tungsten (Mo—W) alloy, molybdenum-chromium (Mo—Cr) alloy, molybdenum-niobium (Ni) alloy, and combinations thereof.

Copper nitride may be disposed on a side surface of the gate barrier layer 131a.

The gate conductive layer 131b is disposed on the gate barrier layer 131a. The gate conductive layer 131b may include copper or copper alloy. When the gate conductive layer 131b includes copper, the resistance of the gate conductive layer 131b is about 2.1 $\mu\Omega$cm to about 2.3 $\mu\Omega$cm. Thus, the resistance of the gate conductive layer 131b is about 30% smaller than that of an aluminum layer, which has a resistance of about 3.1 $\mu\Omega$cm. In addition, the gate conductive layer 131b has lower electro-migration than an aluminum layer.

The gate copper nitride layer 131c is disposed on an upper surface and a side surface of the gate conductive layer 131b. The gate copper nitride layer 131c includes copper nitride. Nitride plasma may be implanted into a copper line to form the gate copper nitride layer 131c. Examples of nitride plasma that may be implanted into the copper line include ammonia ($NH_3$) plasma, nitrogen ($N_2$) plasma, and combinations thereof The gate copper nitride layer 131c prevents the copper of the gate conductive layer 131b from mixing with impurities such as oxygen and silicon. In addition, the gate copper nitride layer 131c has greater resistance to etching than the gate conductive layer 131b and therefore, may protect the gate conductive layer 131b from a subsequent process, such as an etching process or a stripping process.

A gate electrode 118 of the thin film transistor 155 is disposed on the insulating substrate 120. The gate electrode 118 may include copper or copper alloy. The gate electrode 118 may be formed on substantially the same layer as the gate line 131. The gate electrode 118 includes a gate barrier pattern 118a, a gate conductive pattern 118b, and a gate copper nitride pattern 118c.

The gate barrier pattern 118a is disposed on the insulating substrate 120. The gate barrier pattern 118a may include molybdenum (Mo), molybdenum-titanium (Mo—Ti) alloy, molybdenum-tungsten (Mo—W) alloy, molybdenum-chromium (Mo—Cr) alloy, molybdenum-niobium (Ni) alloy, and combinations thereof For example, the gate barrier pattern 118a may include substantially the same material as the gate barrier layer 131a of the gate line 131.

The gate conductive pattern 118b is disposed on the gate barrier pattern 118a. The gate conductive pattern 118b may include copper or copper alloy. For example, the gate conductive pattern 118b may include substantially the same material as the gate conductive layer 131b of the gate line 131.

The gate copper nitride pattern 118c is disposed on an upper surface and a side surface of the gate conductive pattern 118b. The copper nitride pattern 118c may include copper nitride. For example, the gate copper nitride pattern 118c may include substantially the same material as the gate copper nitride layer 131c of the gate line 131.

The gate insulating layer 126 is disposed on the insulating substrate 120 to cover the gate line 131 and the gate electrode 118.

Referring to FIG. 3, the gate insulating layer 126 includes a first gate insulating layer 126a, a second gate insulating layer 126b, and a third gate insulating layer 126c. The gate insulating layer 126 may be formed through a chemical vapor deposition (CVD) method using silane gas and nitride mixture gas. The chemical vapor deposition method may be a plasma enhanced chemical vapor deposition (PECVD) method. The nitride mixture gas may contain nitrogen ($N_2$) gas, ammonia ($NH_3$) gas, and combinations thereof.

The first gate insulating layer 126a is disposed on the insulating substrate 120 on which the gate line 131 and the gate electrode 118 are formed. The first gate insulating layer 126a may include a low density silicon nitride and the density of the first gate insulating layer 126a may be low. The amount of silane gas in the first gas mixture may be no more than about 6.43% by volume. Silicon atoms may be securely combined with nitrogen atoms in the low density silicon nitride. For example, the number of dangling bonds on which electrons may be trapped may be decreased in the low density silicon nitride, which may decrease the deposition speed. In addition, the surface structure of the low density silicon nitride may be dense making it a good electrical insulator.

The second gate insulating layer 126b is disposed on the first gate insulating layer 126a and may include a high density silicon nitride. The density of the second gate insulating layer 126b may be higher than that of the first gate insulating layer 126a. The amount of silane gas in the second gas mixture may be no less than about 6.43% by volume. The second gas mixture may contain more silane gas than the first gas mixture. Silicon atoms may be loosely combined with nitrogen atoms in the high density silicon nitride. For example, the number of dangling bonds may be increased in the high density silicon nitride such that electrons may be trapped in the dangling bonds. The deposition speed of the high density silicon nitride may be faster than that of low density silicon nitride. In addition, the surface structure of the low density silicon nitride may be loose and the high density silicon nitride may be a poorer electrical insulator than the low density silicon nitride.

The third gate insulating layer 126c is disposed on the second gate insulating layer 126b and may include substantially the same low density silicon nitride as the first gate insulating layer 126a. Since the third gate insulating layer 126c includes substantially the same material as the first gate insulating layer 126a, any further explanation concerning the above elements will be omitted. When the third gate insulating layer 126c includes low density silicon nitride, the electrical characteristics of the amorphous silicon pattern 137a of the semiconductor pattern 137 may be improved.

The nitrogen density of the first gate insulating layer 126a may be higher than that of the second gate insulating layer 126b so that copper atoms in the gate line 131 and the gate electrode 118 may not be combined with silicon atoms. The deposition speed of the second gate insulating layer 126b may be faster than that of the first gate insulating layer 126b, thereby decreasing the manufacturing time of the array substrate. The third gate insulating layer 126c may have a denser structure and therefore, more secure electrical characteristics, than the second gate insulating layer 126b. Thus, the third gate insulating layer 126c may improve the electrical characteristics of the amorphous silicon pattern 137a.

Referring again to FIG. 1, FIG. 2, and FIG. 4, the semiconductor pattern 137 of the thin film transistor 155 is disposed on the gate insulating layer 126 corresponding to the gate electrode 118. The semiconductor pattern 137 includes the amorphous silicon pattern 137a and an n+ amorphous silicon pattern 137b.

The amorphous silicon pattern 137a is disposed on the gate insulating layer 126 corresponding to the gate electrode 118. The amorphous silicon pattern 137a may include a lower amorphous silicon pattern (not shown) and an upper amorphous silicon pattern (not shown). The lower amorphous silicon pattern may be deposited at a higher temperature and at a slower speed than the upper amorphous silicon pattern such that it has a denser structure than the upper amorphous silicon pattern.

When an electric field is applied between the gate electrode 118 and the source electrode 117, a channel is formed in the lower amorphous silicon pattern adjacent to the gate insulating layer 126. In FIG. 1, FIG. 2, FIG. 3, and FIG. 4, the lower amorphous silicon pattern has a denser structure than the upper amorphous silicon pattern and therefore, the number of the dangling bonds trapping electrons is smaller in the lower amorphous silicon pattern. Thus, the electrical characteristics of the semiconductor pattern 137 may be improved. In addition, the deposition speed of the upper amorphous silicon pattern may be faster than that of the lower amorphous silicon pattern, which may decrease the manufacturing time.

The n+ amorphous silicon pattern 137b includes a first pattern and a second pattern. The first and second patterns are spaced apart from each other on the amorphous silicon pattern 137a.

The data line 133 is disposed on the gate insulating layer 126. The data line 133 includes a data barrier layer 133a, a data conductive layer 133b, and a data copper nitride layer 133c.

The data barrier layer 133a is on the gate insulating layer 126, the amorphous silicon pattern 137a, and the n+ amorphous silicon pattern 137b. The data barrier layer 133a prevents the silicon atoms of the gate insulating layer 126 from diffusing into the data conductive layer 133b, which may prevent the resistance of the data conductive layer 133b from increasing. Examples of a conductive material that may be included in the data barrier layer 133a include molybdenum (Mo), molybdenum-titanium (Mo—Ti) alloy, molybdenum-tungsten (Mo—W) alloy, molybdenum-chromium (Mo—Cr) alloy, molybdenum-niobium (Mo—Nb) alloy, and combinations thereof. A metal nitride layer may be formed on a side surface of the data barrier layer 133a.

The data conductive layer 133b is disposed on the data barrier layer 133a. The data conductive layer 133b may include copper or copper alloy. For example, the data conductive layer 133b may include substantially the same material as the gate conductive layer 131b. Thus, any further explanation concerning the above elements will be omitted.

The data copper nitride layer 133c is disposed on an upper surface and a side surface of the data conductive layer 133b. The data copper nitride layer 133c may include substantially the same copper nitride as the gate copper nitride layer 131c. Alternatively, a data copper hydrogenated layer may be formed on the upper surface and the side surface of the data conductive layer 133b.

A source electrode 117 of the thin film transistor 155 is disposed on a first pattern of the n+ amorphous silicon pattern. The source electrode 117 may include copper or copper alloy. The source electrode 117 may be formed on substantially the same layer as the data line 133. The source electrode 117 is connected to the data line 133 and includes a source barrier pattern 117a, a source conductive pattern 117b, and a source copper nitride pattern 117c.

The source barrier pattern 117a is disposed on the first pattern of the n+ amorphous silicon pattern. The source barrier pattern 117a may include a conductive material such as molybdenum (Mo), molybdenum-titanium (Mo—Ti) alloy, molybdenum-tungsten (Mo—W) alloy, molybdenum-chromium (Mo—Cr) alloy, molybdenum-niobium (Ni) alloy, and combinations thereof. For example, the source barrier pattern 117a may include substantially the same material as the data barrier layer 133a of the data line 133.

The source conductive pattern 117b is disposed on the source barrier pattern 117a. The source conductive pattern 117b may include copper or copper alloy. For example, the source conductive pattern 117b may include substantially the same material as the data conductive layer 133b of the data line 133.

The source copper nitride pattern 117c is disposed on an upper surface and a side surface of the source conductive pattern 117b. The source copper nitride pattern 117c may include copper nitride. For example, the source copper nitride pattern 117c may include substantially the same material as the data copper nitride layer 133c of the data line 133.

A drain electrode 119 of the thin film transistor 155 is disposed on a second pattern of the n+ amorphous silicon pattern. The drain electrode 119 may include copper or a copper alloy. For example, the drain electrode 119 may be formed from substantially the same layer as the data line 133. The drain electrode 119 is electrically connected to the pixel electrode 112 and includes a drain barrier pattern 119a, a drain conductive pattern 119b, and a drain copper nitride pattern 119c.

The drain barrier pattern 119a is on the second pattern of the n+ amorphous silicon pattern. The drain barrier pattern 119a may include molybdenum (Mo), molybdenum-titanium (Mo—Ti) alloy, molybdenum-tungsten (Mo—W) alloy, molybdenum-chromium (Mo—Cr) alloy, molybdenum-niobium (Ni) alloy, and combinations thereof. For example, the drain barrier pattern 119a may include substantially the same material as the data barrier layer 133a of the data line 133.

The drain conductive pattern 119b is disposed on the drain barrier pattern 119a. The drain conductive pattern 119b may include copper or a copper alloy. For example, the drain conductive pattern 119b may include substantially the same material as the data conductive layer 133b of the data line 133.

The drain copper nitride pattern 119c is disposed on an upper surface and a side surface of the drain conductive pattern 119b. The drain copper nitride pattern 119c may include copper nitride. For example, the drain copper nitride pattern 119c may include substantially the same material as the data copper nitride layer 133c of the data line 133.

The passivation layer 116 is disposed on the gate insulating layer 126 to cover the semiconductor pattern 137, the data line 133, the source electrode 117, and the drain electrode 119. The passivation layer 116 may include silicon nitride. Alternatively, the passivation layer 116 may have a double layered structure including a low density silicon nitride layer and a high density silicon nitride layer. The passivation layer 116 may have a contact hole 151 through which the drain electrode 119 is partially exposed.

The pixel electrode 112 is disposed on the passivation layer 116 and is connected to the drain electrode 119 through the contact hole 151. The pixel electrode 112 may include a transparent conductive material. Examples of the transparent conductive material that may be included in the pixel electrode 112 include indium tin oxide (ITO), indium zinc oxide (IZO), amorphous indium tin oxide (a-ITO), and combinations thereof.

According to the array substrate shown in FIG. 1, FIG. 2, FIG. 3, and FIG. 4, the gate line 131, the gate electrode 118, the data line 133, the source electrode 117, and the drain electrode 119 include the gate copper nitride line 131c, the gate copper nitride pattern 118c, the data copper nitride line 133c, the source copper nitride pattern 117c, and the drain copper nitride pattern 119c, respectively, to decrease the occurrence of defects of the gate line 131, the gate electrode 118, the data line 133, the source electrode 117 and the drain electrode 119. In addition, the gate insulating layer 126 may have a triple layered structure, which may decrease the manufacturing time of the array substrate and improve the electrical characteristics of the amorphous silicon pattern 137a of the array substrate.

FIG. 5, FIG. 6, FIG. 7, FIG. 8, FIG. 9, FIG. 10, FIG. 1, FIG. 12, FIG. 13, FIG. 14, FIG. 15, FIG. 16, FIG. 17, FIG. 18, and FIG. 19 are cross-sectional views showing a method of manufacturing the array substrate shown in FIG. 1.

Figure 5:
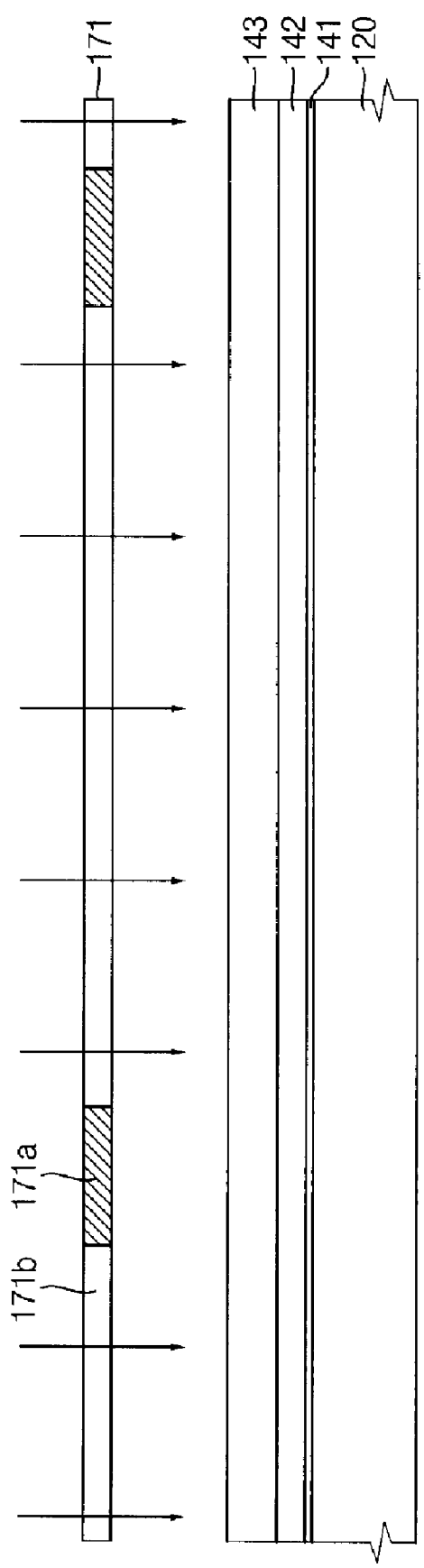
FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, and FIG. 19 are cross-sectional views showing a method of manufacturing the array substrate of FIG. 1.

Referring to FIG. 1 and FIG. 5, a primary gate barrier layer 141 and a primary gate conductive layer 142 are formed on the insulating substrate 120, in sequence. A copper nitride layer (not shown) may be formed on the primary gate conductive layer 142 through a sputtering process. A gate photoresist film 143 is coated on the primary gate conductive layer 142.

The gate photoresist film 143 is exposed through a gate mask 171. The gate mask 171 includes a light blocking portion 171a and a transparent portion 171b. The light blocking portion 171a corresponds to the gate line 131 and the gate electrode 118.

Figure 6:
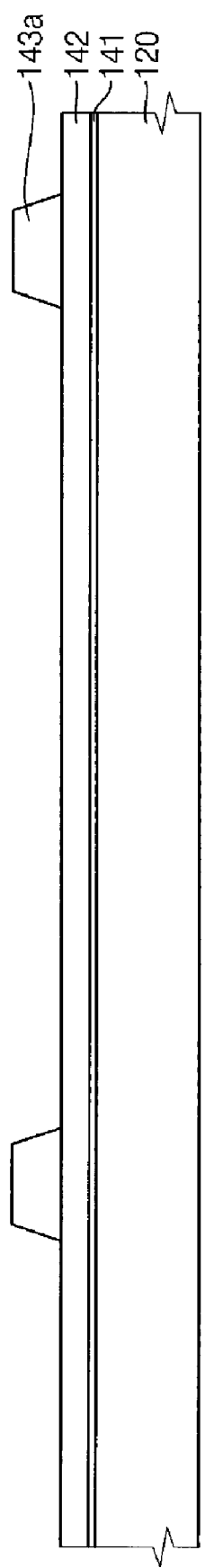

Referring to FIG. 1 and FIG. 6, the exposed gate photoresist film 143 is developed to form a gate photoresist pattern 143a on the primary gate conductive layer 142.

Figure 7:
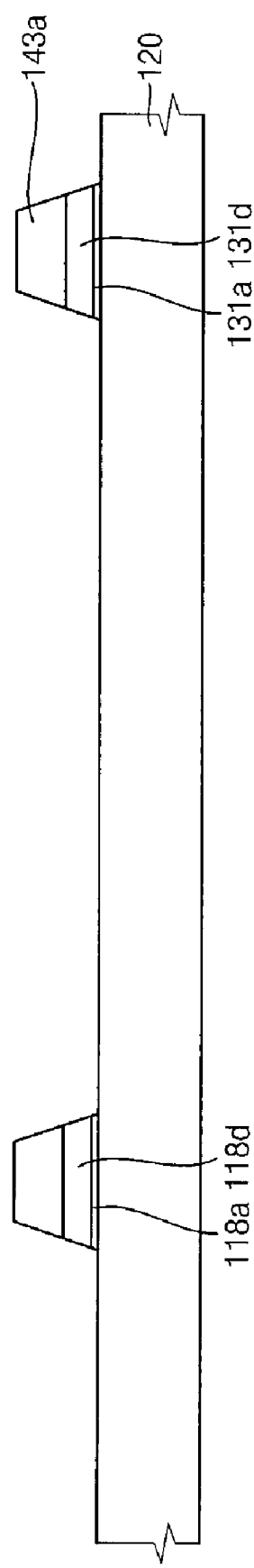

Referring to FIG. 1 and FIG. 7, the primary gate conductive layer 142 and the primary gate barrier layer 141 are partially etched, using the gate photoresist pattern 143a as an etching mask, to form the gate barrier layer 131a, a primary gate conductive layer 131d, the gate barrier pattern 118a, and a primary gate conductive pattern 118d on the insulating substrate 120. The gate photoresist pattern 143a is then removed from the primary gate conductive layer 131d and the primary gate conductive pattern 118c.

Figure 8:
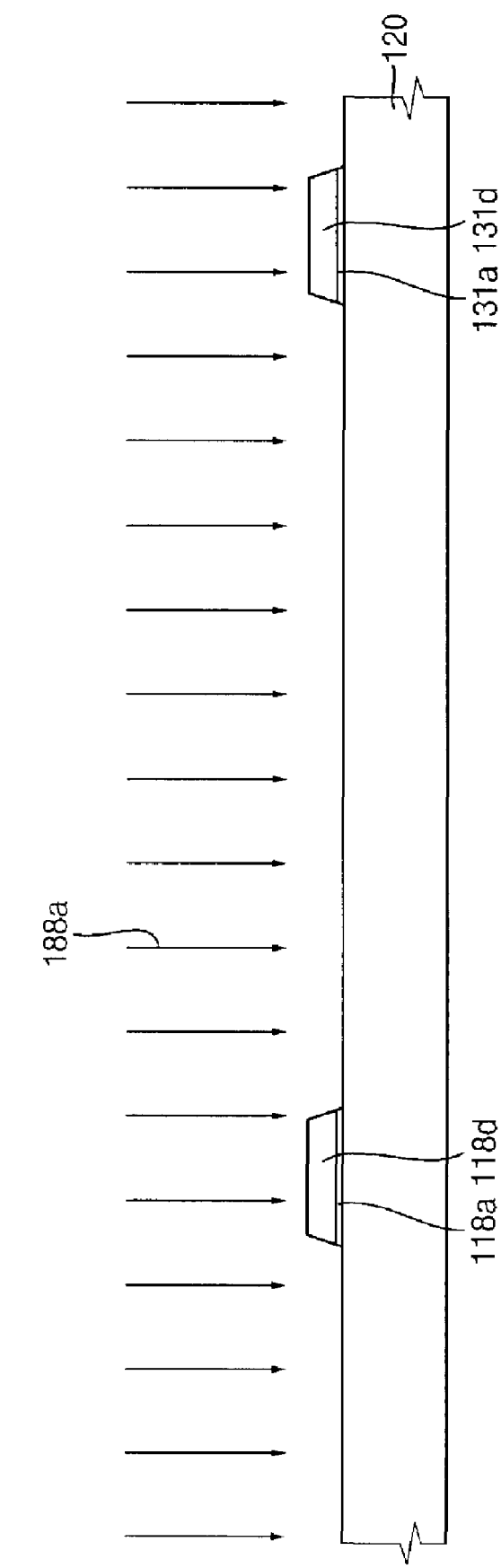

Referring to FIG. 1 and FIG. 8, nitride plasma is applied to the insulating substrate 120, on which the primary gate conductive layer 131d, the gate barrier layer 131a, the gate barrier pattern 118a, and the primary gate conductive pattern 118d are formed. For example, ammonia gas and nitrogen gas may be injected into a chamber (not shown) and an electric power of no less than about 300W may be applied to the ammonia gas and the nitrogen gas for a period of no less than about 20 seconds.

Figure 9:
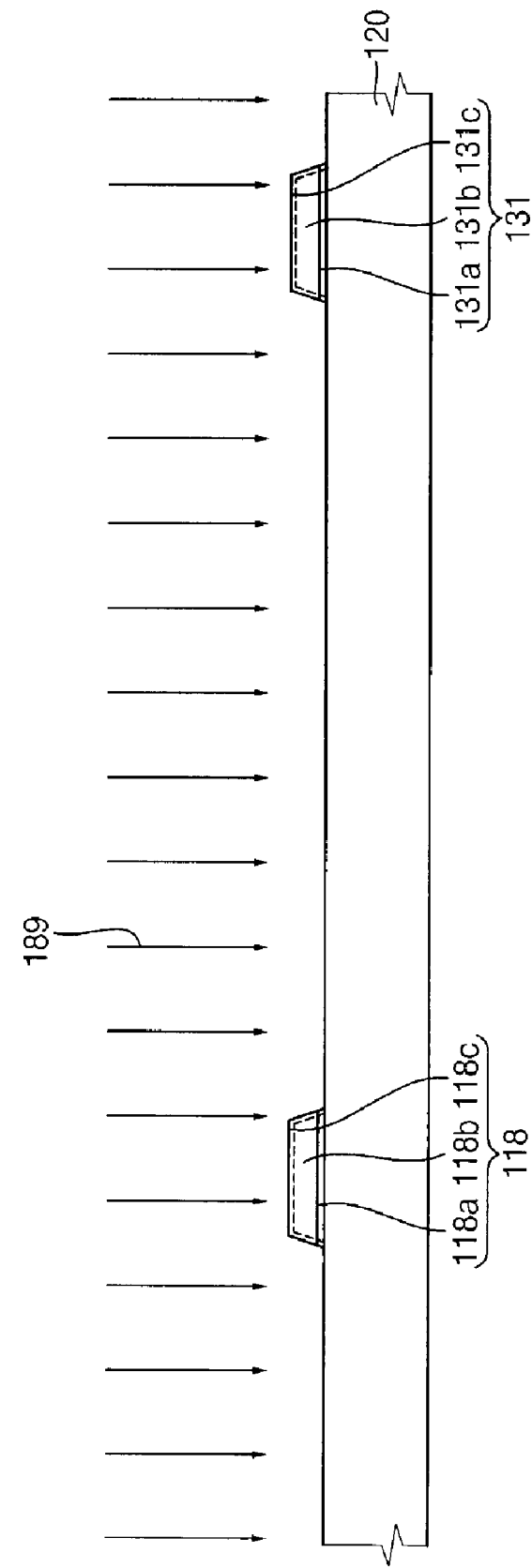

Referring to FIG. 1 and FIG. 9, the nitride plasma 188a (shown in FIG. 8) is injected onto an upper surface and a side surface of the primary gate conductive layer 131d to form the gate conductive layer 131b and the gate copper nitride layer 131c on the gate barrier layer 131a. In addition, the nitride plasma 188a is also injected onto an upper surface and a lower surface of the primary gate conductive pattern 118d to form the gate conductive pattern 118b and the gate copper nitride pattern 118c on the gate barrier pattern 118a.

Furthermore, copper oxide that may be formed on surfaces of the primary gate conductive layer 131d and the primary gate conductive pattern 118d by oxygen or water vapor is converted into copper nitride by the nitride plasma 118a. Copper nitride has better electrical and manufacturing characteristics than copper oxide. For example, copper nitride has less resistance and greater mechanical strength than copper oxide.

A gas mixture, including silane gas and a nitride mixture gas, may be injected onto the insulating substrate 120, on which the gate electrode 118, the gate line 131, and the gate insulating layer 126 (shown in FIG. 2) are formed, through a chemical vapor deposition (CVD) method. Examples of the nitride mixture gas that may be injected onto the insulating substrate 120 include nitrogen gas, ammonia gas, and combinations thereof. The chemical vapor deposition method may be a plasma enhanced chemical vapor deposition (PECVD) method.

FIG. 10, FIG. 11, FIG. 12, and FIG. 13 are cross-sectional views showing a method of disposing the gate insulating layer shown in FIG. 2.

Figure 10:
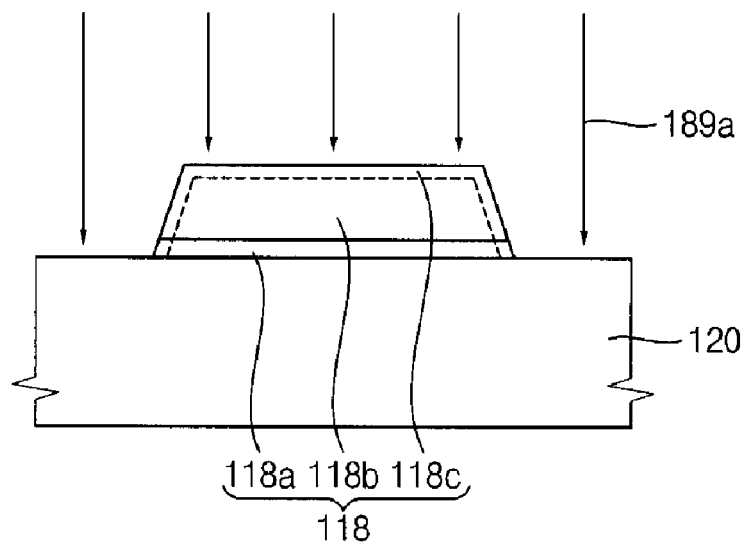

Referring to FIG. 9 and FIG. 10, the first gas mixture is injected into the chamber. The amount of silane gas in the first gas mixture may be no more than about 6.43% by volume. An electric power is applied to the first gas mixture to generate a low density silicon nitride plasma 189a, which is applied to the insulating substrate 120 on which the gate electrode 118 and the gate line 131 are formed. Thus, the first gate insulating layer 126a (shown in FIG. 3), including low density silicon nitride, is formed on the insulating substrate 120 on which the gate electrode 118 and the gate line 131 are formed. For example, the gate insulating layer 126 may be formed in the chamber in which the nitride plasma is applied to the insulating substrate 120, in situ.

When the amount of silane gas in the first gas mixture for forming the first gate insulating layer 126a is no more than about 6.43% by volume, enough nitrogen atoms may be present for the silicon atoms in the silane gas to react with the nitrogen atoms, thereby forming silicon nitride. Thus, the first gate insulating layer 126a may have a dense structure and be a good electrical insulator. However, the deposition speed of the first gate insulating layer 126a may be decreased.

When the amount of silane gas in the first gas mixture for disposing the first gate insulating layer 126a is more than about 6.43% by volume, a portion of the silicon atoms in the silane gas may not react with nitrogen atoms and therefore, the silicon atoms may react with copper atoms of the gate line 131 and the gate electrode 118, forming silicon copper (CuSi). Silicon atoms of the silicon copper may be separated from the copper atoms of the silicon copper and may be implanted into the gate line 131 and the gate electrode 118. When the silicon atoms are implanted into the gate line 131 and the gate electrode 118, the resistance of the gate line 131 and the gate electrode 118 may be greatly increased. However, in FIG. 9 and FIG. 10, the amount of silane gas in the first gas mixture for forming the first gate insulating layer 126a is no more than about 6.43% by volume and therefore, the copper nitride of the gate copper nitride layer 131c and the gate copper nitride pattern 118c may not react with the silicon atoms.

In FIG. 9 and FIG. 10, the amount of silane gas in the first gas mixture for forming the first gate insulating layer 126a is about 2.24% by volume and the electric power applied to the chamber is about 900W. In addition, the thickness of the first gate insulating layer 126a is no less than about 10 Å.

Figure 11:
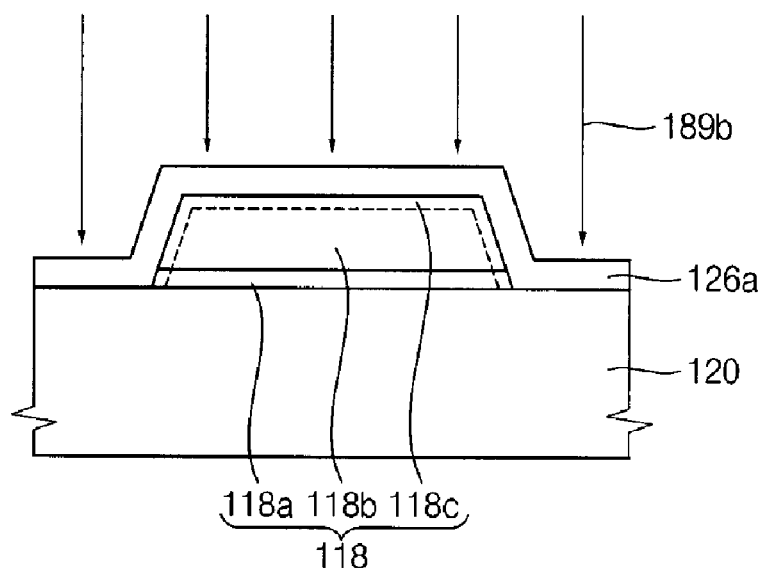

Referring to FIG. 9 and FIG. 11, the second gas mixture for forming the second gate insulating layer 126b (shown in FIG. 3) is injected into the chamber. The amount of silane gas in the second gas mixture is no less than about 6.43% by volume. An electric power is applied to the second gas mixture to generate high density silicon nitride plasma 189b, and the high density silicon nitride plasma 189b is applied to the first gate insulating layer 126a. Thus, the second gate insulating layer 126b (shown in FIG. 3), including high density silicon nitride, is disposed on the first gate insulating layer 126a. For example, the first gate insulating layer 126a and the second gate insulating layer 126b may be formed in the chamber, in situ.

When the amount of silane gas in the second gas mixture for disposing the second gate insulating layer 126b is no less than about 6.43% by volume, the silicon atoms in the silane gas may not sufficiently react with the nitrogen atoms in the nitride mixture gas. Thus, the second gate insulating layer 126b may have a loose structure and the insulating characteristics of the second gate insulating layer 126b may be poorer than that of the first gate insulating layer 126a such that the second gate insulating layer 126b has a smaller electrical resistance than the first gate insulating layer 126a. However, the deposition speed of the second gate insulating layer 126b may be faster than that of the first gate insulating layer 126a.

In FIG. 9 and FIG. 11, the first gate insulating layer 126a may block the silicon atoms to protect the gate electrode 118 and the gate line 131, even though the amount of the silane gas in the second gas mixture for forming the second gate insulating layer 126b may be no less than about 6.43% by volume. Thus, the silicon atoms may not be implanted into the gate line 131 and the gate electrode 118.

For example, the amount of silane gas in the second gas mixture for forming the second gate insulating layer 126b may be about 6.43% by volume and the electric power applied to the chamber may be about 1200W.

Figure 12:
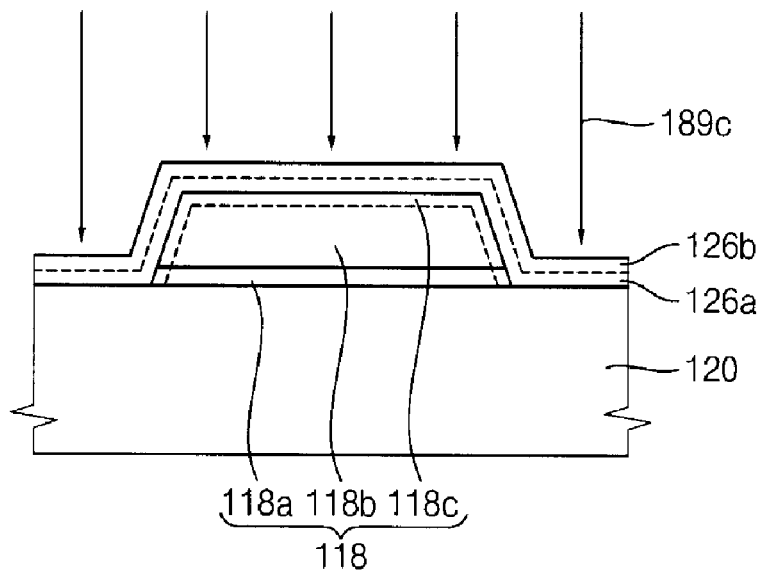

Referring to FIG. 9 and FIG. 12, the third gas mixture for forming the third gate insulating layer 126c (shown in FIG. 3) is injected into the chamber. The amount of silane gas in the third gas mixture is no more than about 6.43% by volume. Electric power is applied to the third gas mixture to generate a low density silicon nitride plasma 189c, which is applied to the second gate insulating layer 126b. Thus, the third gate insulating layer 126c, including low density silicon nitride, is formed on the second gate insulating layer 126b.

When the amount of silane gas in the third gas mixture for forming the third gate insulating layer 126c is no more than about 6.43% by volume, the third gate insulating layer 126c may have a dense structure and may be a good electrical insulator. However, the deposition speed of the third gate insulating layer 126c may be decreased.

In FIG. 9 and FIG. 12, the amount of the silane gas in the third gas mixture for forming the third gate insulating layer 126c may be about 2.24% by volume and the electric power applied to the chamber may be about 900W.

Figure 13:
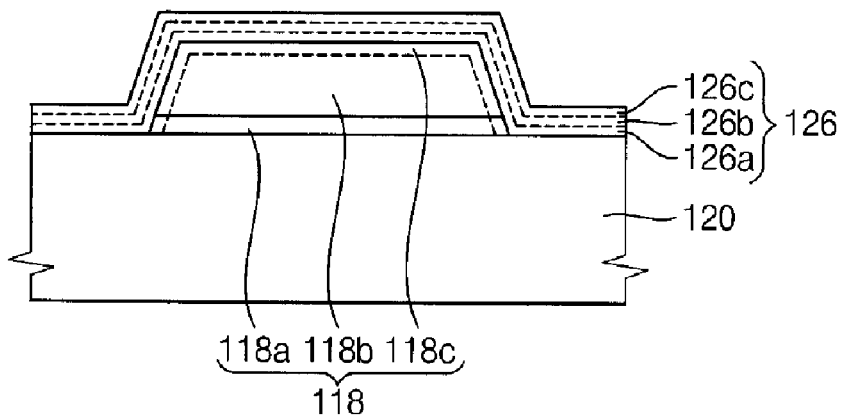
Figure 14:
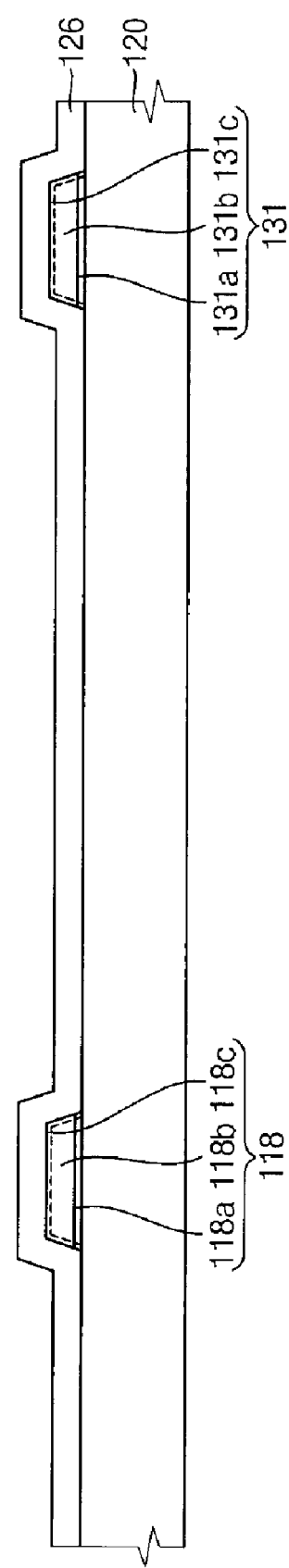

Referring to FIG. 13 and FIG. 14, the gate insulating layer 126, including the first gate insulating layer 126a, the second gate insulating layer 126b, and the third gate insulating layer 126c, is formed on the insulating substrate 120 on which the gate electrode 118 and the gate line 131 are formed.

Figure 15:
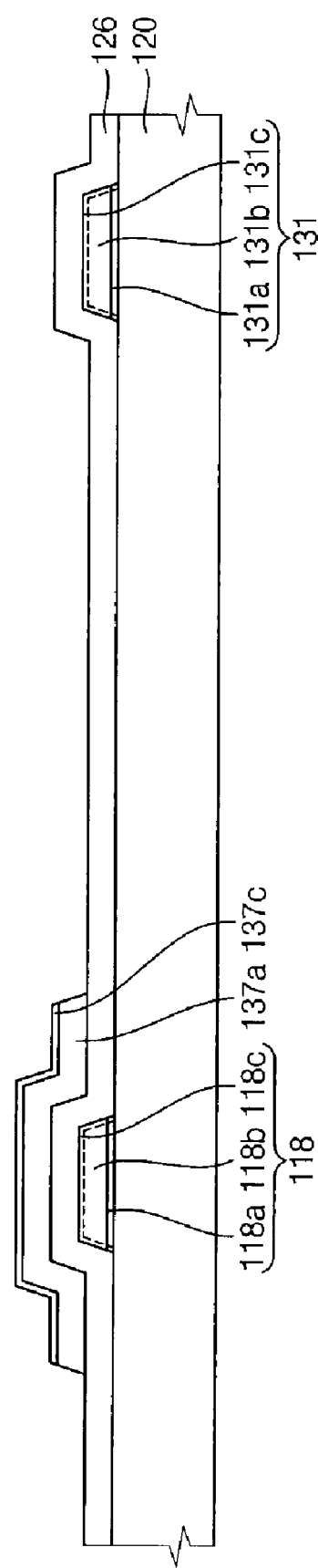

Referring to FIG. 15, a lower amorphous silicon layer (not shown) and an upper amorphous silicon layer (not shown) are deposited on the gate insulating layer 126, in sequence. The upper amorphous silicon layer may have a looser structure than the lower amorphous silicon layer.

The lower amorphous silicon layer may be deposited at a low electric power and at a decreased speed so that the lower amorphous silicon layer may have a dense structure and good electrical characteristics. The upper amorphous silicon layer may be deposited at a high electric power and at an increased speed so that the upper amorphous silicon layer may have a loose structure. For example, the lower amorphous silicon layer may be formed at an electric power of about 150W and the upper amorphous silicon layer may be formed at an electric power of about 300W. The amorphous silicon layer is deposited on the gate insulating layer 126 and includes the lower amorphous silicon layer and the upper amorphous silicon layer.

Then, n+ impurities are implanted into an upper portion of the amorphous silicon layer to form an n+ amorphous silicon layer (not shown).

The n+ amorphous silicon layer and the amorphous silicon layer are partially etched to form a primary n+ amorphous silicon pattern 137c and the amorphous silicon pattern 137a.

Figure 16:
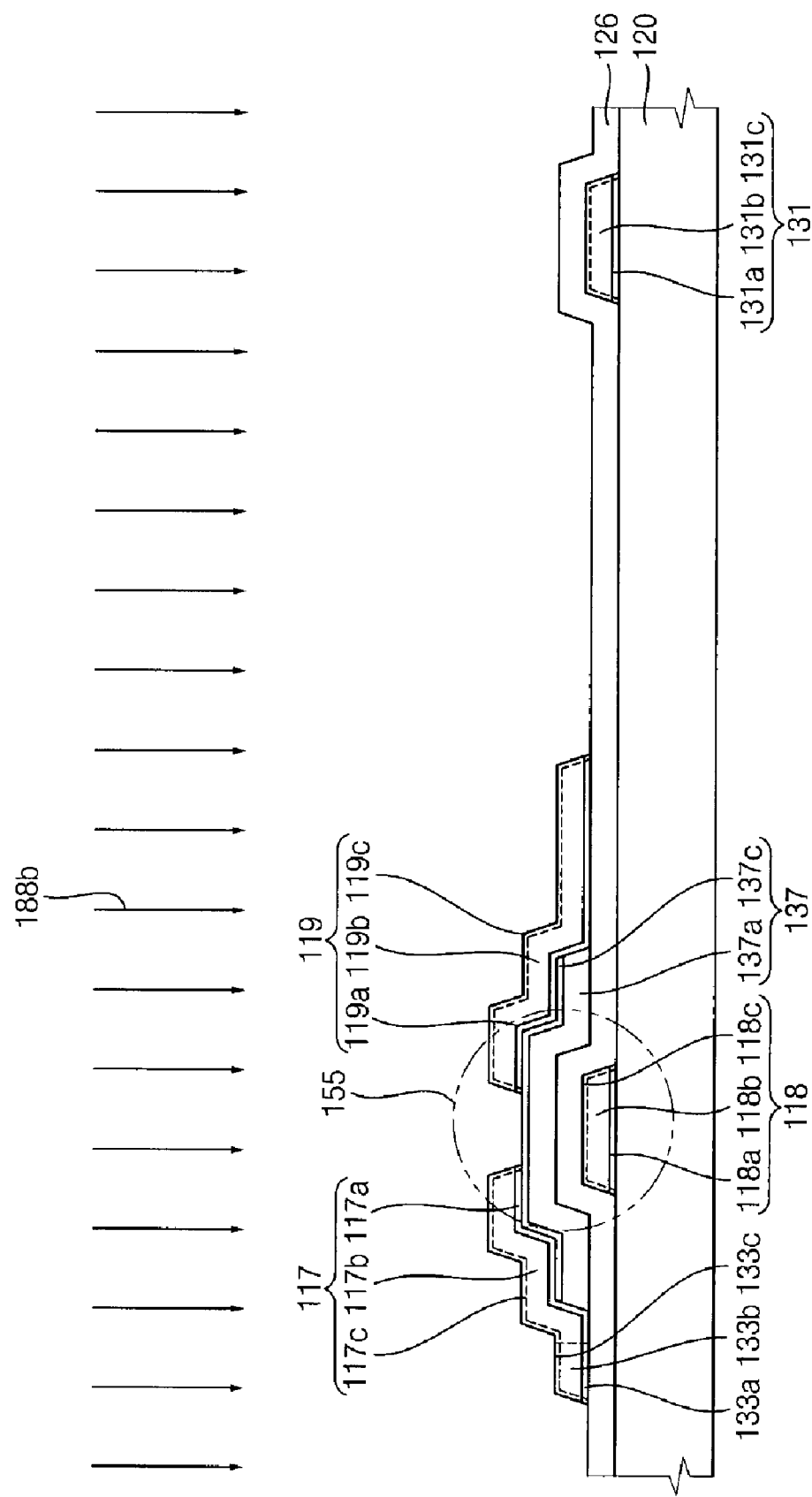

Referring to FIG. 16, a primary data barrier layer (not shown) and a primary data conductive layer (not shown) are formed on the gate insulating layer 126, in sequence. The gate insulating layer 126 includes the primary n+ amorphous silicon pattern 137c and the amorphous silicon pattern 137a. Alternatively, a copper nitride layer (not shown) may be deposited on the primary data conductive layer through a sputtering process. A data photoresist film (not shown) is formed on the primary data conductive layer.

The primary data barrier layer and the primary data conductive layer are partially etched through a photolithography process using a data mask (not shown) to form the data barrier layer 133a, a primary data conductive layer 133d, the source barrier pattern 117a, a primary source conductive pattern 117d, the drain barrier pattern 119a, and a primary drain conductive pattern 119d.

The nitride plasma 188b is implanted onto the gate insulating layer 126 including the primary n+ amorphous silicon pattern 137c, the amorphous silicon pattern 137a, the data barrier layer 133a, a primary data conductive layer 133d, the source barrier pattern 117a, a primary source conductive pattern 117d, the drain barrier pattern 119a, and a primary drain conductive pattern 119d.

Figure 17:
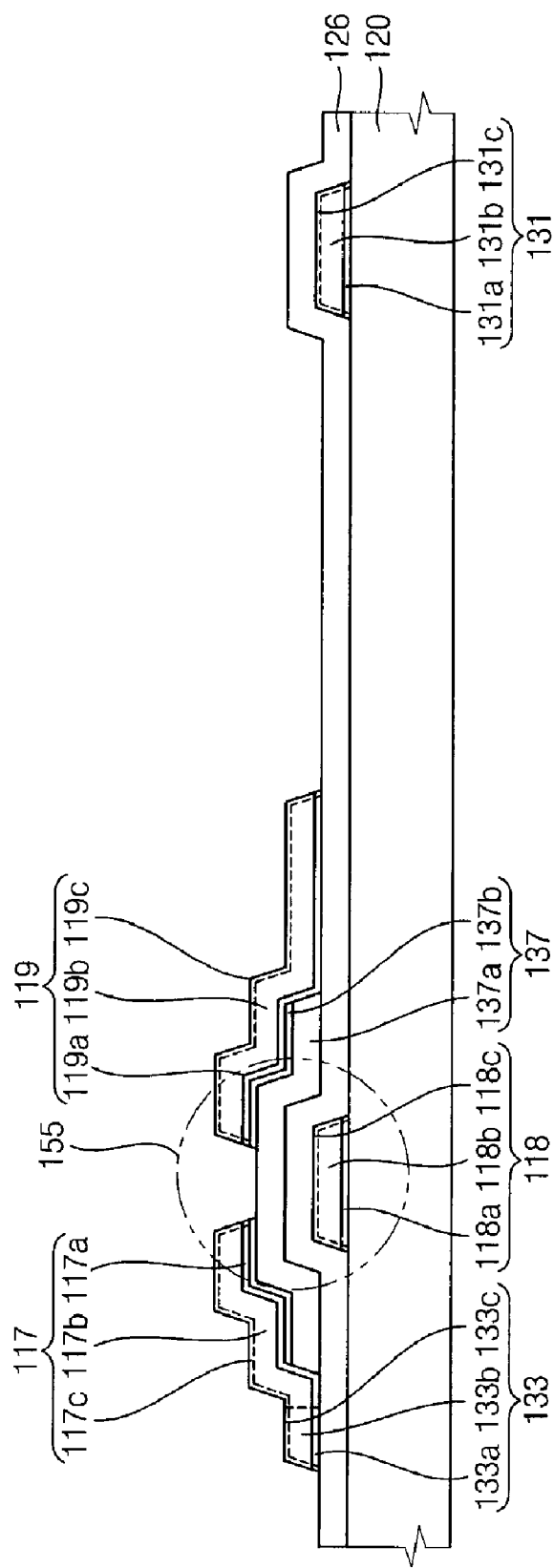

Referring to FIG. 16 and FIG. 17, the nitride plasma 188b is implanted onto upper and side surfaces of the primary data conductive layer 133d, the primary source conductive pattern 117d, and the primary drain conductive pattern 119d to form the data conductive layer 133b, the data copper nitride layer 133c, the source conductive pattern 117b, the source copper nitride pattern 117c, the drain conductive pattern 119b, and the drain copper nitride pattern 119c. For example, ammonia gas and nitrogen gas may be injected into a chamber (not shown), and an electric power of about 300W may be applied to the ammonia gas and the nitrogen gas for more than about 20 seconds.

Referring to FIG. 17, the primary n+ amorphous silicon pattern 137c (shown in FIG. 16) interposed between the source electrode 117 and the drain electrode 119 is partially etched, using the source electrode 117 and the drain electrode 119 as an etching mask, to form the semiconductor pattern 137 including the n+ amorphous silicon pattern 137b and the amorphous silicon pattern 137a.

The data copper nitride layer 133c, the source copper nitride pattern 117c, and the drain copper nitride pattern 119c may protect the data line 133, the source electrode 117, and the drain electrode 119, respectively, from the etchant for etching the primary n+ amorphous silicon pattern 137c.

In FIG. 15, FIG. 16, and FIG. 17, the semiconductor pattern 137, the data line 133, the source electrode 117, and the drain electrode 119 are formed using two photo masks. Alternatively, the semiconductor pattern, the data line, the source electrode, and the drain electrode may be formed using one photo mask.

Figure 18:
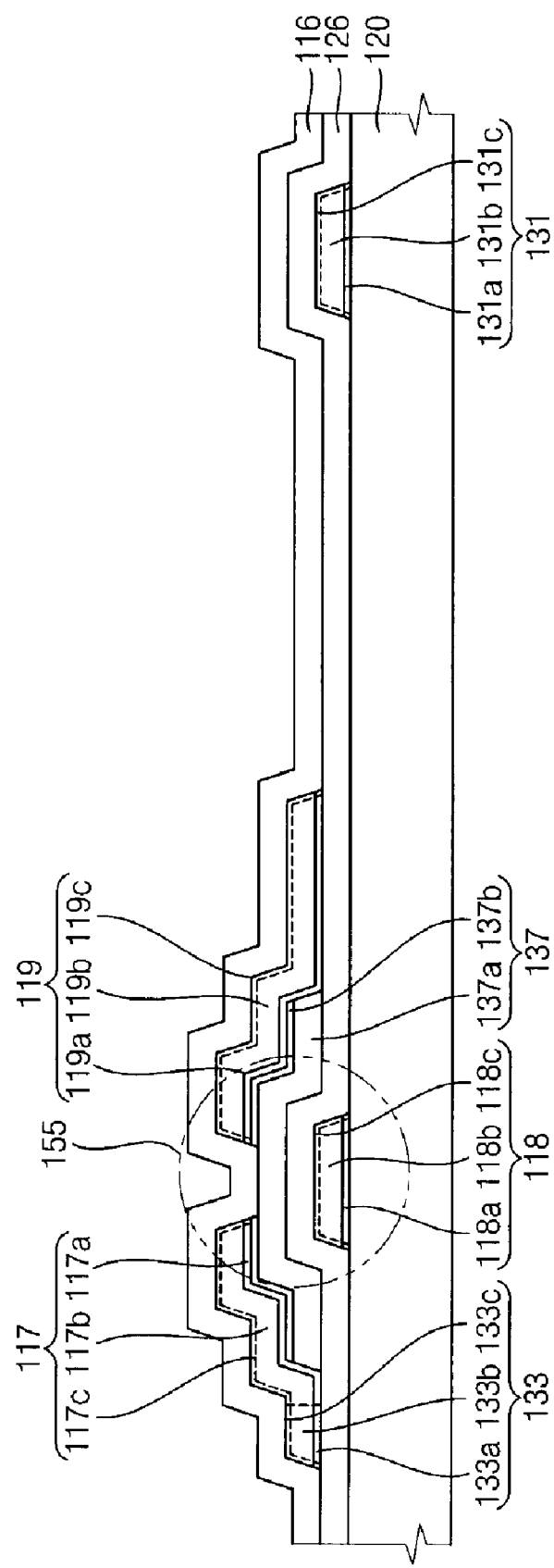

Referring to FIG. 18, the passivation layer 116 is formed on the gate insulating layer 126 to cover the semiconductor pattern 137, the data line 133, the source electrode 117, and the drain electrode 119. For example, silane gas and the nitride mixture gas may be injected onto the gate insulating layer 126, and the passivation layer 116 may be formed on the gate insulating layer 126 by a chemical vapor deposition (CVD) method.

As shown in FIG. 18, the passivation layer 116 may include a first passivation layer (not shown) and a second passivation layer (not shown). The second passivation layer may be disposed on the first passivation layer.

The first passivation layer may include low density silicon nitride. The method for forming the low density silicon nitride of the first passivation layer is substantially the same as that described with respect to FIG. 10. Thus, any further explanation concerning the above elements will be omitted.

The second passivation layer may include high density silicon nitride. The method for forming the high density silicon nitride of the second passivation layer is substantially the same as that described with respect to FIG. 11. Thus, any further explanation concerning the above elements will be omitted.

In FIG. 18, the passivation layer 116 has a double layered structure including first and second passivation layers. Alternatively, the passivation layer may have a single layered structure or a multi-layered structure including no less than three layers.

Figure 19:
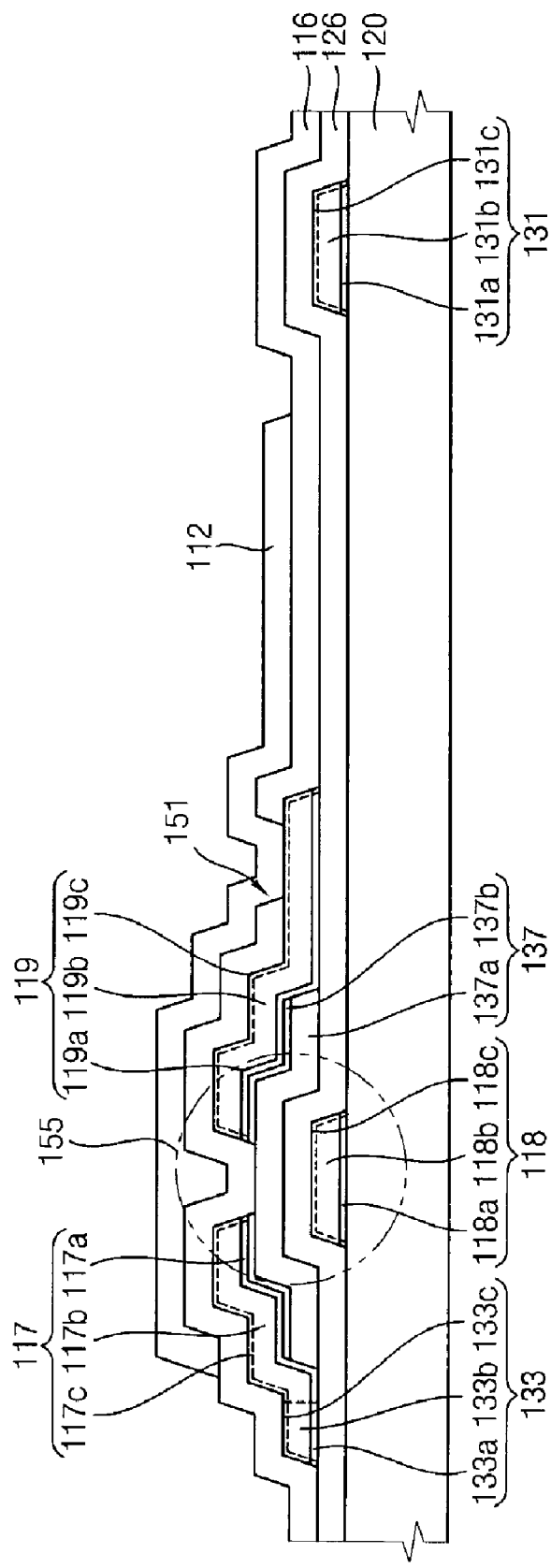

Referring to FIG. 19, the passivation layer 116 may be partially etched to form the contact hole 151 through which the drain electrode 119 is partially exposed. Alternatively, a laser beam may be irradiated onto the pixel electrode 112 corresponding to the drain electrode 119 to form the contact hole 151 after the pixel electrode 112 is formed.

The pixel electrode 112 connected to the drain electrode 119 is formed on the passivation layer 116 and the contact hole 151 is formed in the passivation layer 116.

According to the method of manufacturing the display substrate of FIG. 4, FIG. 5, FIG. 6, FIG. 7, FIG. 8, FIG. 9, FIG. 10, FIG. 11, FIG. 12, FIG. 13, FIG. 14, FIG. 15, FIG. 16, FIG. 17, FIG. 18, and FIG. 19, an additional protective layer for protecting an upper portion of the gate line 131, the gate electrode 118, the data line 133, the source electrode 117, and the drain electrode 119 may be omitted, thereby decreasing manufacturing time of the display substrate.

In addition, the copper nitride layer may cover the side surface of the data line 133, the source electrode 117, and the drain electrode 119 to prevent the data line 133, the source electrode 117, and the drain electrode 119 from the etchant for etching the primary n+ amorphous silicon pattern 137c.

EXAMPLE I

A primary gate conductive pattern 188d (shown in FIG. 8) was treated by nitride plasma or hydrogen plasma. A gate insulating layer having a multilayered structure and including a low density silicon nitride layer and a high density silicon nitride layer was deposited on the substrate. The nitride plasma or the hydrogen plasma was generated by an electric power of about 600W during about 20 seconds. An electric power of about 900W was applied to a gas mixture including silane gas and a nitride mixture gas and the amount of silane gas in the gas mixture was about 2.24% by volume. An electric power of about 1200W was applied to a gas mixture including silane gas and a nitride mixture gas and the amount of the silane gas in the gas mixture was about 6.43% by volume.

When a first low density silicon nitride layer, a high density silicon nitride layer, and a second low density silicon nitride layer were formed after the nitride plasma treatment, the resistance of the gate line was about 2.1 µΩcm to 2.3 µΩcm.

When a first low density silicon nitride layer, a high density silicon nitride layer, and a second low density silicon nitride layer were formed after the hydrogen plasma treatment, the resistance of the gate line was about 2.5 µΩcm to 2.8 µΩcm.

When a high density silicon nitride layer and a low density silicon nitride layer were formed after the nitride plasma treatment, the resistance of the gate line was about 2.9 µΩcm to 3.0 µΩcm.

When a high density silicon nitride layer and a low density silicon nitride layer were formed after the hydrogen plasma treatment, the resistance of the gate line was about 3.0 μΩcm to 3.1 μΩcm.

Therefore, when the first low density silicon nitride layer, the high density silicon nitride layer, and the second low density silicon nitride layer were formed, in sequence, after the nitride plasma treatment, the resistance of the gate line was minimized.

Figure 20:
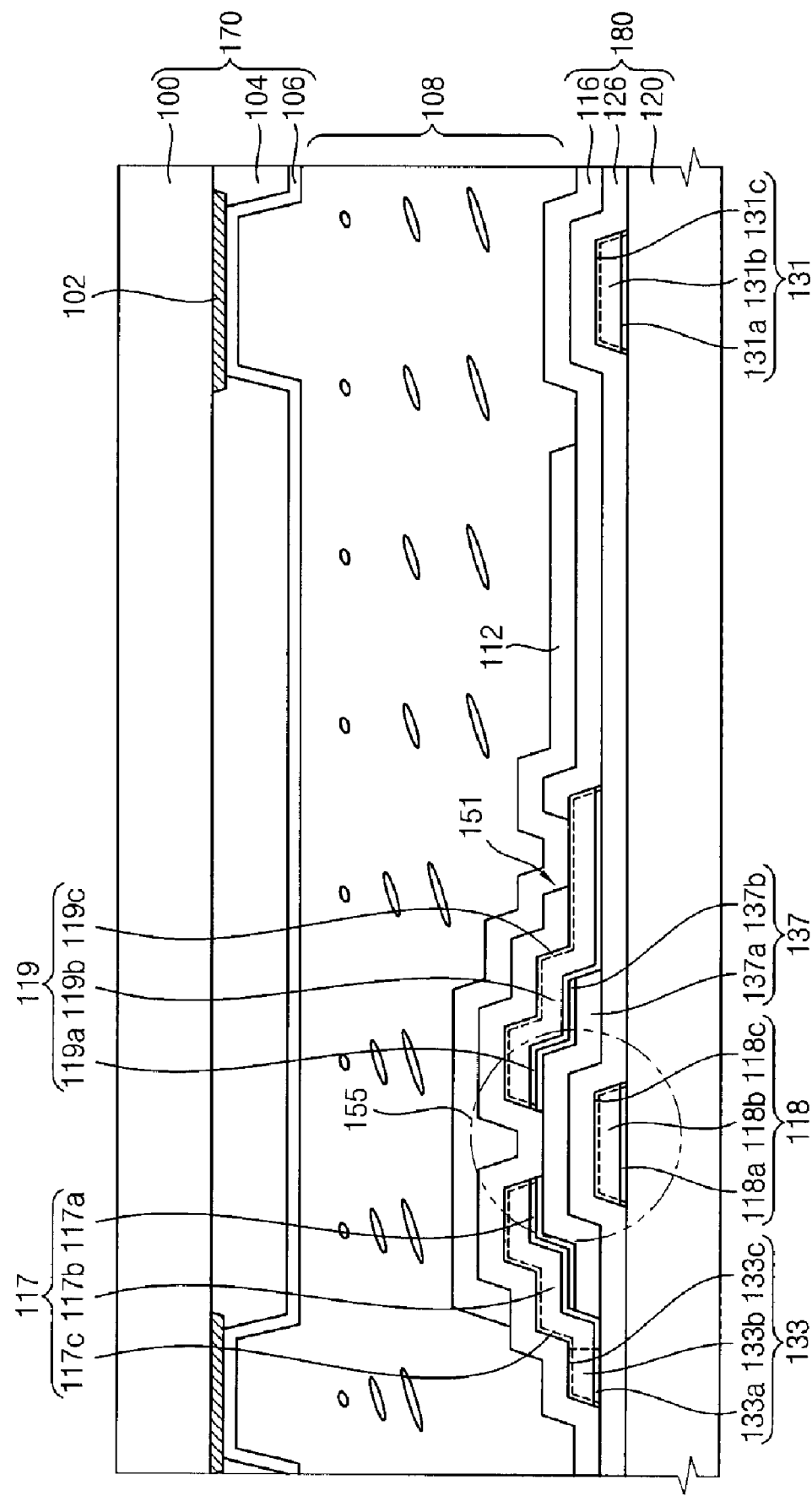
FIG. 20 is a cross-sectional view showing a display device in accordance with another exemplary embodiment of the present invention.

FIG. 20 is a cross-sectional view showing a display device in accordance with another exemplary embodiment of the present invention.

Referring to FIG. 20, the display device includes an array substrate 180, an opposite substrate 170, and a liquid crystal layer 108. The array substrate 180 of FIG. 20 is the same as that of FIG. 1, FIG. 2, FIG. 3, and FIG. 4. Thus, the same reference numerals will be used to refer to the same or like parts and any further explanation concerning the above elements will be omitted.

The opposite substrate 170 includes an opposite insulating substrate 100, a black matrix 102b, a color filter 104, and a common electrode 106. The opposite substrate 170 may further include a plurality of color filters.

The opposite insulating substrate 100 includes a transparent insulating material. Examples of the transparent insulating material that may be included in the opposite insulating substrate 100 include glass, quartz, and synthetic resin. For example, the opposite insulating substrate 100 may include a transparent synthetic resin.

The black matrix 102 is on the opposite insulating substrate 100 to block light that is incident in a region in which liquid crystals are incontrollable. Thus, it may be possible to improve the contrast ratio of the display device.

The color filter 104 is on the opposite insulating substrate 100, on which the black matrix 102 is formed, to transmit color light having a wavelength corresponding to a color. The color filter 104 corresponds to a pixel electrode 112 of the array substrate 180.

The common electrode 106 is on the opposite insulating substrate 100 on which the black matrix 102 and the color filter 104 are formed. The common electrode 106 includes a transparent conductive material. Examples of the transparent conductive material include indium tin oxide (ITO), indium zinc oxide (IZO), amorphous indium tin oxide (a-ITO), and combinations thereof.

A spacer (not shown) may be interposed between the array substrate 180 and the opposite substrate 170 to maintain a distance between the array substrate 180 and the opposite substrate 170. The spacer may be a bead spacer, a ball spacer, or a column spacer.

A liquid crystal layer 108 is interposed between the array substrate 180 and the opposite substrate 170. When a voltage difference occurs between the common electrode 106 and the pixel electrode 112, an electric field is formed between the common electrode 106 and the pixel electrode 112. The orientations of the liquid crystals of the liquid crystal layer 108 vary in response to the electric field formed between the common electrode 106 and the pixel electrode 112. Thus, light transmittance of the liquid crystal layer 108 is changed and an image having a gray-scale is displayed.

A sealant (not shown) may seal the liquid crystal layer 108 between the array substrate 180 and the opposite substrate 170.

Accordingly, the occurrence of defects in the array substrate 180 of the display device of FIG. 20 may be decreased and the manufacturing process of the array substrate 180 may be simplified. Thus, the image display quality of the display device may be improved and the manufacturing cost of the display device may be decreased.

Figure 21:
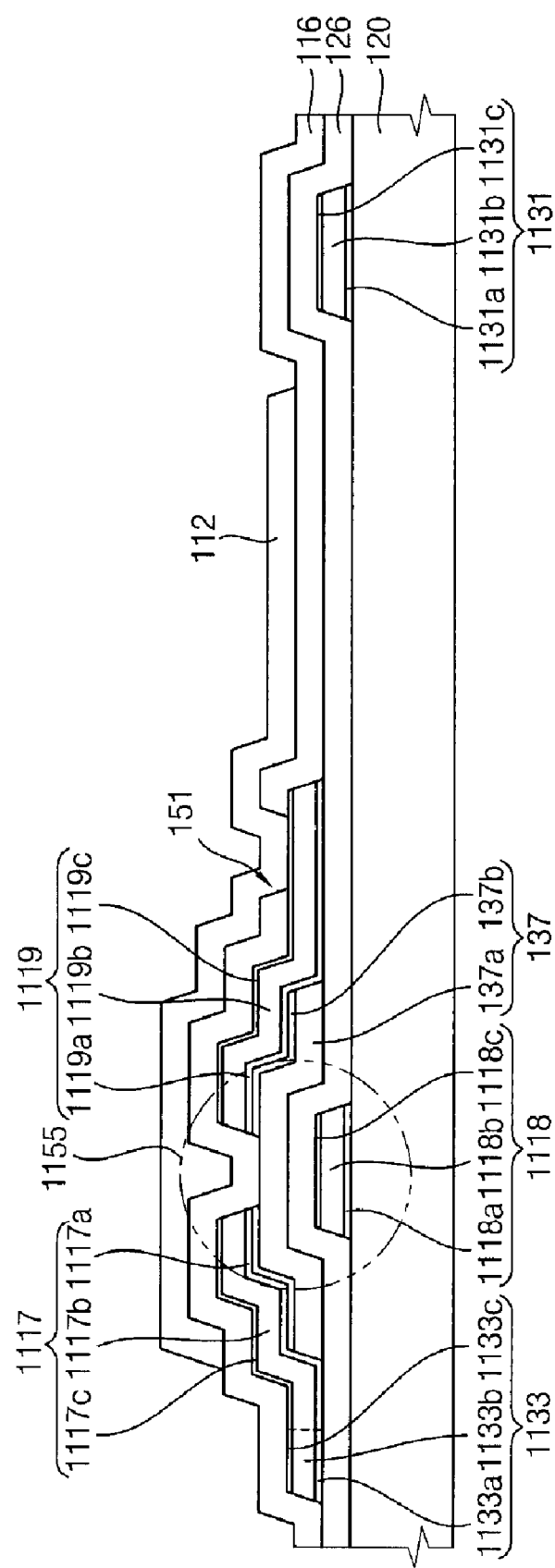
FIG. 21 is a cross-sectional view showing an array substrate in accordance with another embodiment of the present invention.

FIG. 21 is a cross-sectional view showing an array substrate in accordance with another embodiment of the present invention. The array substrate of FIG. 21 is substantially the same as that of FIG. 1, FIG. 2, FIG. 3, and FIG. 4, except for the gate line, the gate electrode, the data line, the source electrode, and the drain electrode. Thus, the same reference numerals will be used to refer to the same or like parts and any further explanation concerning the above elements will be omitted.

Referring to FIG. 21, the gate line 1131 is disposed on an insulating substrate 120 and includes a gate barrier layer 1131a, a gate conductive layer 1131b, and a gate copper nitride layer 1131c.

The gate barrier layer 1131a is disposed on the insulating substrate 120. The gate barrier layer 1131a may include molybdenum (Mo), molybdenum-titanium (Mo—Ti) alloy, molybdenum-tungsten (Mo—W) alloy, molybdenum-chromium (Mo—Cr) alloy, molybdenum-niobium (Ni) alloy, and combinations thereof. The gate barrier layer 1131a may increase the adhesive strength between the gate line 1131 and the insulating substrate 120.

The gate conductive layer 1131b is disposed on the gate barrier layer 1131a. The gate conductive layer 1131b may include copper or copper alloy.

The gate copper nitride layer 1131c is disposed on an upper surface of the gate conductive layer 1131b. The gate copper nitride layer 1131c may prevent copper of the gate conductive layer 1131b from being combined with silicon of the gate insulating layer 126. The gate copper nitride layer 1131c may include copper nitride. For example, the gate copper nitride layer 1131c may be formed through a copper sputtering process in a nitrogen atmosphere.

The gate electrode 1118 of the thin film transistor 1155 is on the insulating substrate 120. The gate electrode 1118 is formed on substantially the same layer as the gate line 1131 and includes a gate barrier pattern 1118a, a gate conductive pattern 1118b, and a gate copper nitride pattern 1118c.

The gate barrier pattern 1118a is disposed on the insulating substrate 120. The gate barrier pattern 1118a may include substantially the same material as the gate barrier layer 1131a of the gate line 1131.

The gate conductive pattern 1118b is disposed on the gate barrier pattern 1118a. The gate conductive pattern 1118b may include copper or copper alloy. For example, the gate conductive pattern 1118b may include substantially the same material as the gate conductive layer 1131b of the gate line 1131.

The gate copper nitride pattern 1118c is disposed on an upper surface of the gate conductive pattern 1118b. The gate copper nitride pattern 1118c may include copper nitride. For example, the gate copper nitride pattern 1118c may include substantially the same material as the gate copper nitride layer 1131c of the gate line 1131.

The data line 1133 is disposed on the gate insulating layer 126. The data line 1133 includes a data barrier layer 1133a, a data conductive layer 1133b, and a data copper nitride layer 1133c.

The data barrier layer 1133a is disposed on the gate insulating layer 126, an amorphous silicon pattern 137a, and an n+ amorphous silicon pattern 137b. The data barrier layer 1133a prevents the silicon atoms of the gate insulating layer 126 from diffusing into the data conductive layer 1133b.

The data conductive layer 1133b is disposed on the data barrier layer 1133a. The data conductive layer 1133b may include copper or copper alloy. For example, the data conductive layer 1133b may include substantially the same material as the gate conductive layer 1131b. Thus, any further explanation concerning the above elements will be omitted.

The data copper nitride layer 1133c is formed on an upper surface of the data conductive layer 1133b. The data copper nitride layer 1133c may include copper nitride. For example, the data copper nitride layer 1133c may include substantially the same copper nitride as the gate copper nitride layer 1131c.

A source electrode 1117 of the thin film transistor 1155 is on a first pattern of the n+ amorphous silicon pattern. The source electrode 1117 may include copper or copper alloy. For example, the source electrode 1117 may be formed on substantially the same layer as the data line 1133. The source electrode 1117 is connected to the data line 1133 and includes a source barrier pattern 1117a, a source conductive pattern 1117b, and a source copper nitride pattern 1117c.

The source barrier pattern 1117a is on the first pattern of the n+ amorphous silicon pattern. The source barrier pattern 1117a may include substantially the same material as the data barrier layer 1133a of the data line 1133.

The source conductive pattern 1117b is disposed on the source barrier pattern 1117a. The source conductive pattern 1117b may include copper or copper alloy. For example, the source conductive pattern 1117b may include substantially the same material as the data conductive layer 1133b of the data line 1133.

The source copper nitride pattern 1117c is disposed on an upper surface of the source conductive pattern 1117b. The source copper nitride pattern 1117c may include copper nitride. For example, the source copper nitride pattern 1117c may include substantially the same material as the data copper nitride layer 1133c of the data line 1133.

A drain electrode 1119 of the thin film transistor 1155 is disposed on a second pattern of the n+ amorphous silicon pattern. The drain electrode 1119 is formed on substantially the same layer as the data line 1133. The drain electrode 1119 is connected to the pixel electrode 1112 and includes a drain barrier pattern 1119a, a drain conductive pattern 1119b, and a drain copper nitride pattern 1119c.

The drain barrier pattern 1119a is disposed on the second pattern of the n+ amorphous silicon pattern. The drain barrier pattern 1119a may include substantially the same material as the data barrier layer 1133a of the data line 1133.

The drain conductive pattern 1119b is disposed on the drain barrier pattern 1119a. The drain conductive pattern 1119b may include copper or copper alloy. For example, the drain conductive pattern 1119b may include substantially the same material as the data conductive layer 1133b of the data line 1133.

The drain copper nitride pattern 1119c is disposed on an upper surface of the drain conductive pattern 1119b and may include copper nitride. For example, the drain copper nitride pattern 1119c may include substantially the same material as the data copper nitride layer 1133c of the data line 1133.

FIG. 22, FIG. 23, FIG. 24, FIG. 25, and FIG. 26 are cross-sectional views showing a method of manufacturing the array substrate shown in FIG. 21. The method of FIG. 22, FIG. 23, FIG. 24, FIG. 25, and FIG. 26 is substantially the same as in FIG. 5, FIG.6, FIG. 7, FIG. 8, FIG. 9, FIG. 10, FIG. 11, FIG. 12, FIG. 13, FIG. 14, FIG. 15, FIG. 16, FIG. 17, FIG. 18, and FIG. 19, except with regard to the processes for forming the gate line, the gate electrode, the data line, the source electrode, and the drain electrode. Thus, the same reference numerals will be used to refer to the same or like parts and any further explanation concerning the above elements will be omitted.

Figure 22:
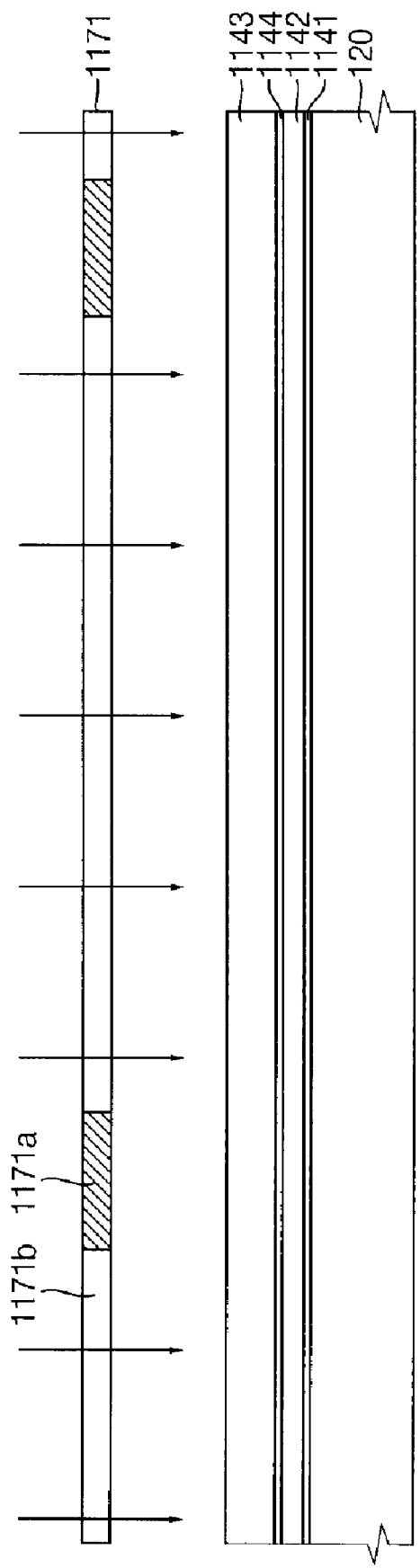
FIG. 22, FIG. 23, FIG. 24, FIG. 25, and FIG. 26 are cross-sectional views showing a method of manufacturing the array substrate shown in FIG. 21.

Referring to FIG. 21 and FIG. 22, a primary gate barrier layer 1141 and a primary gate conductive layer 1142 are formed on the insulating substrate 120, in sequence. A primary copper nitride layer 1144 is deposited on the primary gate conductive layer 1142 through a sputtering process. A gate photoresist film 1143 is coated on the primary gate copper nitride layer 1144.

The gate photoresist film 1143 is exposed to ultraviolet light through a gate mask 1171. The gate mask 1171 includes a light blocking portion 1171a and a transparent portion 1171b. The light blocking portion 1171 blocks a portion of the ultraviolet light and the remaining portion of the ultraviolet light passes through the transparent portion 1171b. The light blocking portion 1171a corresponds to the gate line 1131 and the gate electrode 1118 and the transparent portion 1171b corresponds to the remainder of the array substrate.

Figure 23:
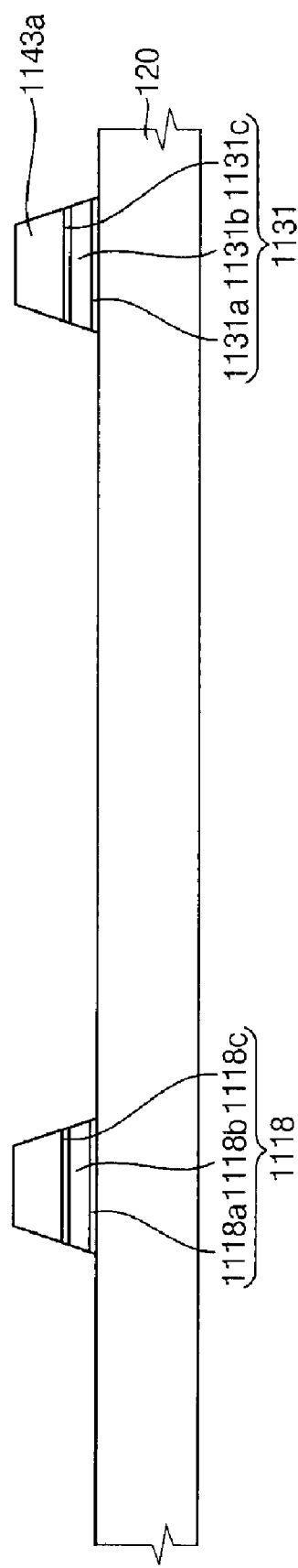

Referring to FIG. 23, the exposed gate photoresist film 1143 is developed, using a developing agent, to form a gate photoresist pattern 1143a on the primary gate copper nitride layer 1144.

The primary gate conductive layer 1142, the primary gate barrier layer 1141, and the primary gate copper nitride layer 1144 are partially etched, using the gate photoresist pattern 1143a as an etching mask, to form the gate line 1131 and the gate electrode 1118 on the insulating substrate 120.

The gate copper nitride layer 1131c of the gate line 1131 may have substantially the same etching rate as the copper of the gate conductive layer 1131b, thereby improving the etching uniformity of the gate line 1131. For example, when a molybdenum layer (not shown) on a gate conductive layer having a different etching rate than the gate conductive layer is formed on a gate conductive layer, the molybdenum layer may be over-etched such that a portion of the gate conductive layer may be exposed. However, in FIG. 23, the gate copper nitride layer 1131c has substantially the same etching rate as the gate conductive layer 1131b, thereby improving the etching profile of the gate line 1131.

The gate photoresist pattern 143a is removed from the gate line 1131 and the gate electrode 1118.

Figure 24:
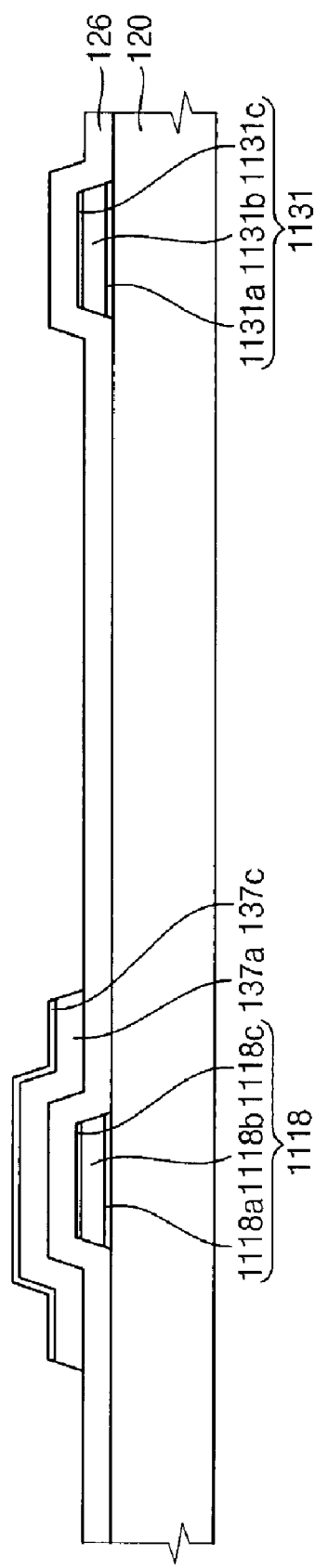

Referring to FIG. 24, a gate insulating layer 126 is formed on the insulating substrate 120 to cover the gate line 1131 and the gate electrode 1118.

An amorphous silicon pattern 137a is formed on the gate insulating layer corresponding to the gate electrode 1118. A primary n+ amorphous silicon pattern 137c is formed on the amorphous silicon pattern 137a.

Figure 25:
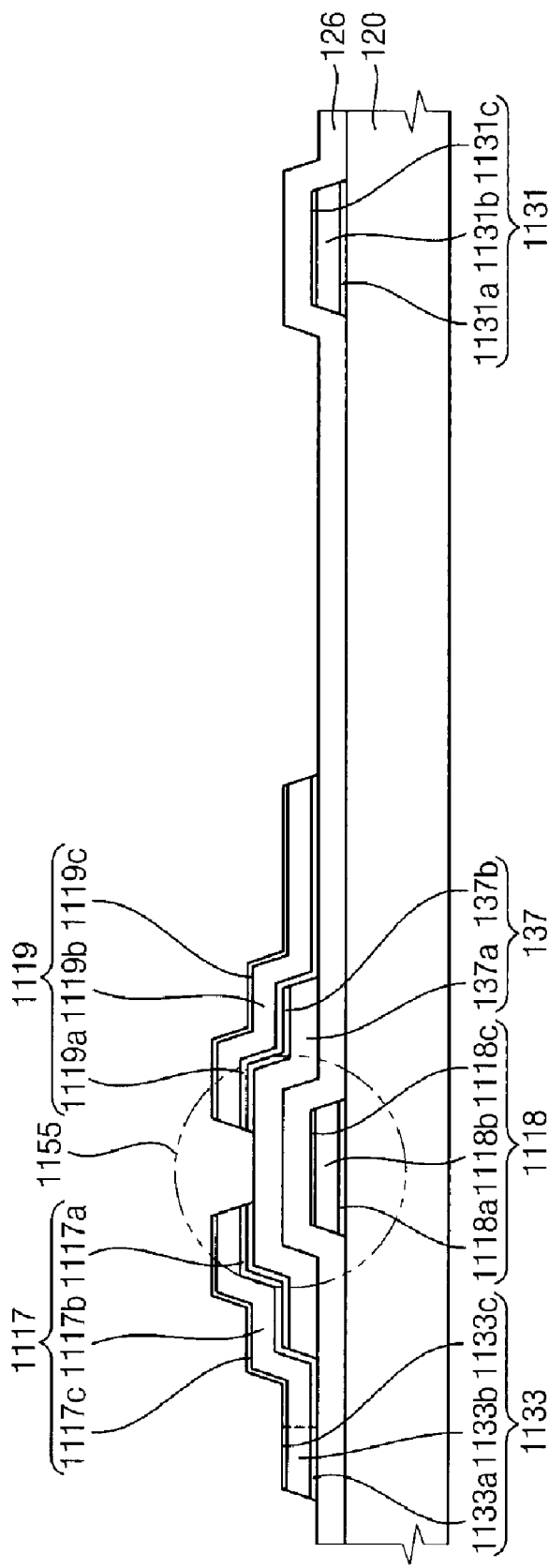

Referring to FIG. 25, a primary data barrier layer (not shown) and a primary data conductive layer (not shown) are formed on the gate insulating layer 126, on which the amorphous silicon pattern 137a and the primary n+amorphous silicon pattern 137c (shown in FIG. 24) are formed, in sequence. A primary data copper nitride layer (not shown) is deposited on the primary data conductive layer. For example, the primary data copper nitride layer may be deposited through a sputtering process. A data photoresist film (not shown) may be formed on the primary data copper nitride layer.

The primary data barrier layer, the primary data conductive layer, and the primary data copper nitride layer are partially etched through a photolithography process using a data mask (not shown) to form the data line 1133, the source electrode 1117, and the drain electrode 1119 on the gate insulating layer 126. Alternatively, nitride plasma may be implanted into each of the data line 1133, the source electrode 1117, and the drain electrode 1119 to form a copper nitride layer (not shown) on each of a side surface of the data conductive layer 1133b of the data line 1133, a side surface of the source conductive pattern 1117b of the source electrode 1117, and a side surface of the drain conductive pattern 1119b of the drain electrode 1119.

The primary n+ amorphous silicon pattern 137c (shown in FIG. 24) interposed between the source electrode 1117 and the drain electrode 1119 is partially etched, using the source electrode 1117 and the drain electrode 1119 as an etching mask, so that the amorphous silicon pattern 137a is partially exposed between the source electrode 1117 and the drain electrode 1119. Also, the primary n+ amorphous silicon pattern 137c is divided into two patterns spaced apart from each other and corresponding to the source electrode 1117 and the drain electrode 1119.

Figure 26:
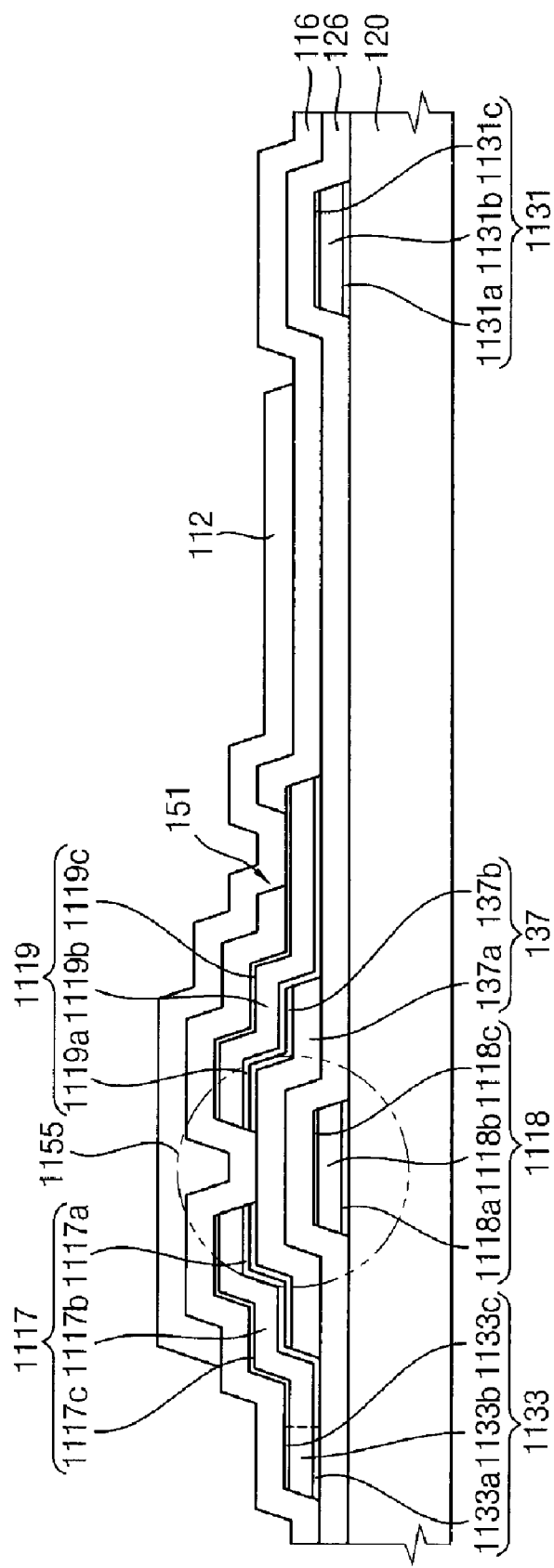

Referring to FIG. 26, the passivation layer 116 is formed on the gate insulating layer 126 to cover the semiconductor pattern 137, the data line 1133, the source electrode 1117, and the drain electrode 1119. The passivation layer 116 is partially etched to form a contact hole 151 through which the drain electrode 1119 is partially exposed.

The pixel electrode 112 is connected to the drain electrode 1119 through the contact hole 151 and is formed on the passivation layer 116 having the contact hole 151.

According to the method of manufacturing the array substrate of FIG. 22, FIG. 23, FIG. 24, FIG. 25, and FIG. 26, each of the gate line 1131, the gate electrode 1118, the data line 1133, the source electrode 1117, and the drain electrode 1119 includes a copper nitride layer that has substantially the same etching rate as the copper of the gate conductive layer 1131b, which may improve the etching profile of the gate line 1131, the gate electrode 1118, the data line 1133, the source electrode 1117, and the drain electrode 1119. Thus, the occurrence of defects in the array substrate may be decreased.

Figure 27:
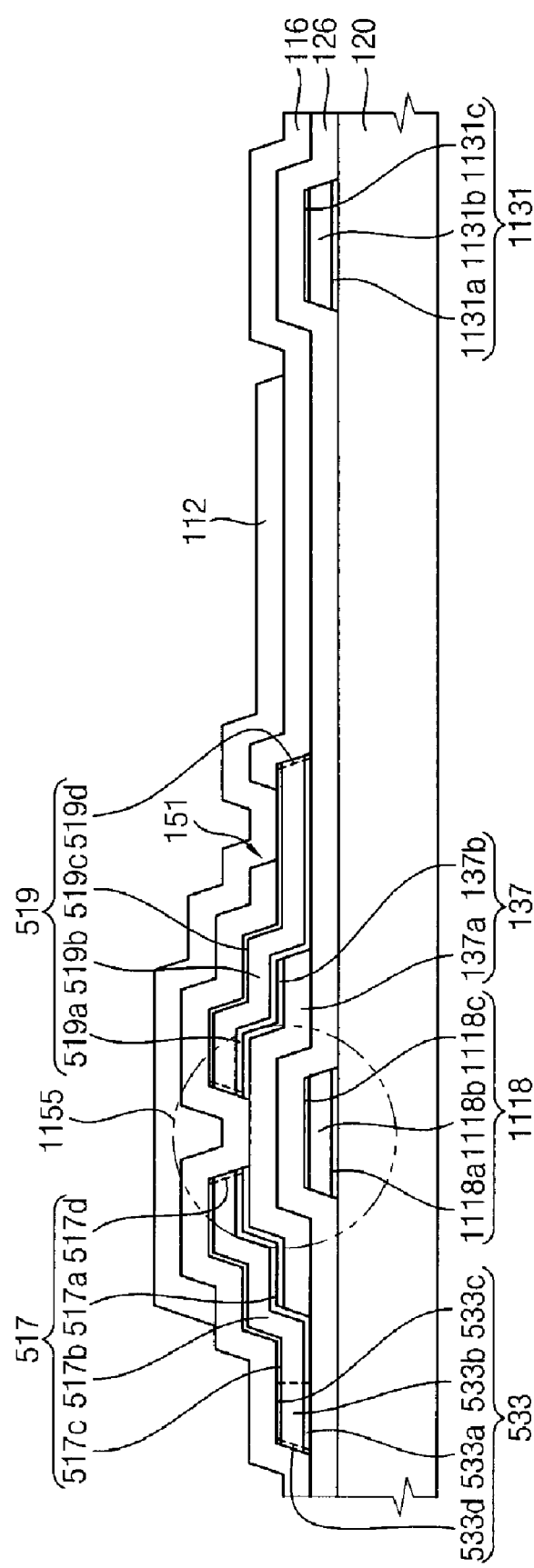
FIG. 27 is a cross-sectional view showing an array substrate in accordance with another exemplary embodiment of the present invention.

FIG. 27 is a cross-sectional view showing an array substrate in accordance with another embodiment of the present invention. The array substrate of FIG. 27 is substantially the same as in FIG. 21 except for the data line, the source electrode, and the drain electrode. Thus, the same reference numerals will be used to refer to the same or like parts and any further explanation concerning the above elements will be omitted.

Referring to FIG. 27, the data line 533 includes a data barrier layer 533a, a data conductive layer 533b, a data copper nitride layer 533c, and a side copper nitride layer 533d.

The data copper nitride layer 533c is disposed on an upper surface of the data conductive layer 533b to protect the data line 533 during subsequent processes. The subsequent processes may include an etching process for forming an n+ amorphous silicon pattern 137b, a cleaning process, and a deposition process.

The side copper nitride layer 533d is disposed on a side surface of the data conductive layer 533b to protect the data line 533 during the subsequent processes. For example, the side copper nitride layer 533d protects the data line 533 during the etching process for forming the n+ amorphous silicon pattern 137b such that the data line 533 may not be etched by an etchant for etching a primary n+ amorphous silicon pattern.

The source electrode 517 is formed on substantially the same layer as the data line 533. The source electrode 517 includes a source barrier pattern 517a, a source conductive pattern 517b, a source copper nitride pattern 517c, and a first side surface copper nitride pattern 517d.

The source copper nitride pattern 517c is disposed on an upper surface of the source conductive pattern 517b.

The first side copper nitride pattern 517d is disposed on a side surface of the source conductive pattern 517b to protect the source electrode 517 during the etching process for forming the n+ amorphous silicon pattern 137b.

The drain electrode 519 is formed on substantially the same layer as the data line 533. The drain electrode 519 includes a drain barrier pattern 519a, a drain conductive pattern 519b, a drain copper nitride pattern 519c, and a second copper nitride pattern 519d.

The drain copper nitride pattern 519c is disposed on an upper surface of the drain conductive pattern 519b.

The second side copper nitride pattern 519d is disposed on a side surface of the drain conductive pattern 519b to protect the source electrode 519 during the etching process for forming the n+ amorphous silicon pattern 137b. The second side copper nitride pattern 519d may protect the source electrode 519 during subsequent processes including the cleaning process and the deposition process.

The data copper nitride layer 533c, the source copper nitride pattern 517c, and the drain copper nitride pattern 519c of FIG. 27 may be formed through substantially the same sputtering process as described with respect to FIG. 25. The side copper nitride layer 533d, the first side copper nitride pattern 517d, and the second side copper nitride pattern 519d of FIG. 27 may be formed using substantially the same nitride plasma as described with respect to FIG. 16. Alternatively, each of the upper and side surfaces of the data line 533, the source electrode 517, and the drain electrode 519 may be covered by a copper nitride layer.

Accordingly, in the array substrate of FIG. 27, the etching uniformity of the data line 533, the source electrode 517, and the drain electrode 519 may be improved, which may increase the yield of the array substrate.

Figure 28:
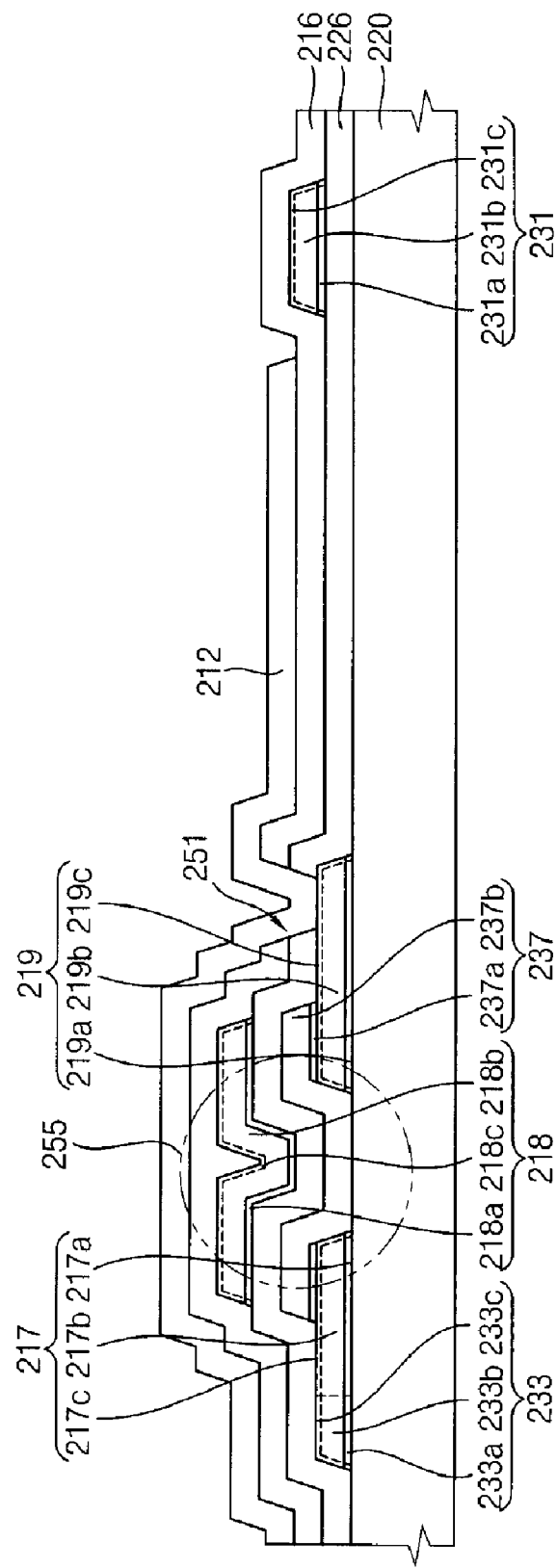
FIG. 28 is a cross-sectional view showing an array substrate in accordance with another exemplary embodiment of the present invention.

FIG. 28 is a cross-sectional view showing an array substrate in accordance with another exemplary embodiment of the present invention.

Referring to FIG. 28, the array substrate includes an insulating substrate 220, a data line 233, a gate line 231, a thin film transistor 255, a gate insulating layer 226, a passivation layer 216, and a pixel electrode 212. Alternatively, the array substrate may include a plurality of data lines, a plurality of gate lines, a plurality of thin film transistors, and a plurality of pixel electrodes.

The data line 233 includes a data barrier layer 233a, a data conductive layer 233b, and a data copper nitride layer 233c. The data barrier layer 233a is disposed on the insulating substrate 220 and the data conductive layer 233b is disposed on the data barrier layer 233a. The data copper nitride layer 233c is disposed on an upper surface and a side surface of the data conductive layer 233b.

A source electrode 217 of the thin film transistor 255 is formed on substantially the same layer as the data line 233 and is connected to the data line 233.

The source electrode 217 includes a source barrier pattern 217a, a source conductive pattern 217b, and a source copper nitride pattern 217c. The source copper nitride pattern 217c is disposed on an upper surface and a side surface of the source conductive pattern 217b.

A drain electrode 219 of the thin film transistor 255 is formed from substantially the same layer as the data line 233. The drain electrode 219 is spaced apart from the source electrode 217.

The drain electrode 219 includes a drain barrier pattern 219a, a drain conductive pattern 219b, and a drain copper nitride pattern 219c. The drain copper nitride pattern 219c is disposed on an upper surface and a side surface of the drain conductive pattern 219b.

A semiconductor pattern 237 of the thin film transistor 255 is interposed between the source electrode 217 and the drain electrode 219. The semiconductor pattern 237 includes an n+ amorphous silicon pattern 237b and an amorphous silicon pattern 237a. The n+ amorphous silicon pattern 237b includes a first pattern on the source electrode 217 and a second pattern on the drain electrode 219. The amorphous silicon pattern 234a is disposed on the n+ amorphous silicon pattern 237b and the portion of the insulating substrate 220 between the source electrode 217 and the drain electrode 219.

The gate insulating layer 226 is disposed on the insulating substrate 220 and covers the data line 233, the source electrode 217, the drain electrode 219, and the semiconductor pattern 237. The gate insulating layer 226 and the passivation layer 216 have a contact hole 251 through which the drain electrode 219 is partially exposed.

A gate electrode 218 of the thin film transistor 255 is disposed on the gate insulating layer 226 corresponding to the semiconductor pattern 237. The gate electrode 218 includes a gate barrier pattern 218a, a gate conductive pattern 218b, and a gate copper nitride pattern 218c. The gate copper nitride pattern 218c is disposed on an upper surface and a side surface of the gate conductive pattern 218b.

The gate line 231 is formed on substantially the same layer as the gate electrode 218 and is connected to the gate electrode 218.

The gate line 231 includes a gate barrier layer 231a, a gate conductive layer 231b, and a gate copper nitride layer 231c. The gate conductive layer 231b is disposed on the gate barrier layer 231a and the gate copper nitride layer 231c is disposed on an upper surface and a side surface of the gate conductive layer 231b.

The passivation layer 216 is disposed on the gate insulating layer 226 to cover the gate electrode 218 and the gate line 231. The drain electrode 219 is partially exposed through the contact hole 251 formed in the passivation layer and the gate insulating layer 226.

The pixel electrode 212 is disposed on the passivation layer 216. The pixel electrode 212 is connected to the drain electrode 219 through the contact hole 251 formed in the passivation layer 216.

Accordingly, in the array substrate of FIG. 28, the resistance of the data line 233 on the insulating substrate 220 and the gate line 231 on the gate insulating layer 226 may be decreased, which may improve the image display quality of a display device.

Figure 29:
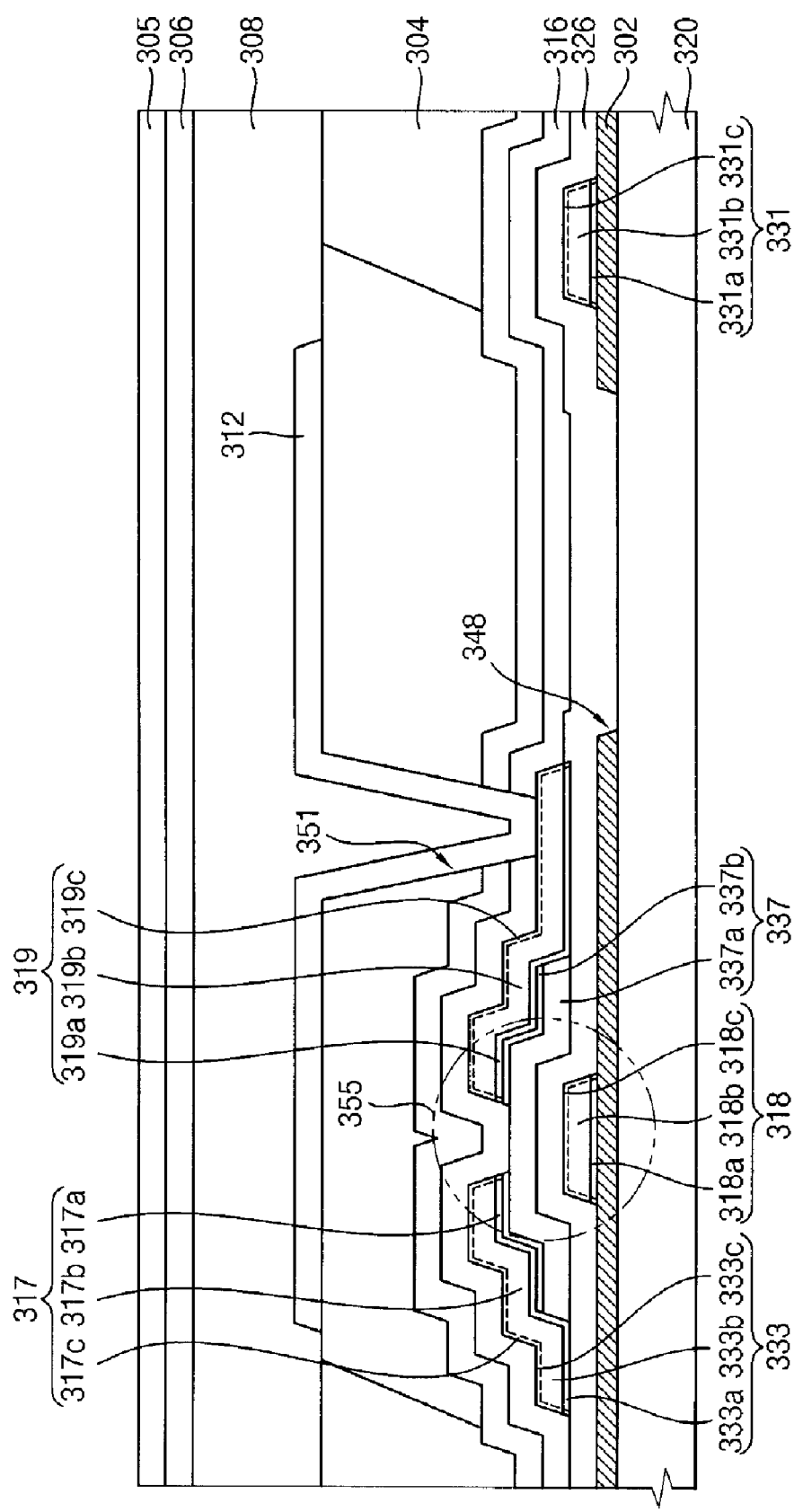
FIG. 29 is a cross-sectional view showing a display device in accordance with another exemplary embodiment of the present invention.

FIG. 29 is a cross-sectional view showing a display device in accordance with another exemplary embodiment of the present invention.

Referring to FIG. 29, the display device includes an insulating substrate 320, a black matrix 302, a gate line 331, a data line (not shown), a driving voltage line 333, a driving transistor 355, a switching transistor (not shown), a gate insulating layer 326, a passivation layer 316, a color filter 304, a pixel electrode 312, an organic light emitting layer 308, an opposite electrode 306, and a protecting layer 305. Alternatively, the display device may include a plurality of gate lines, a plurality of data lines, a plurality of driving voltage lines, a plurality of driving transistors, a plurality of switching transistors, a plurality of color filters, and a plurality of pixel electrodes.

The black matrix 302 is formed on the insulating substrate 320 to block light. The black matrix 302 includes a plurality of openings 348 arranged in a matrix. Each of the openings 348 of the black matrix 302 may correspond to a pixel electrode 312.

The gate line 331 is disposed on the black matrix 302 and includes a gate barrier layer 331a, a gate conductive layer 331b, and a gate copper nitride layer 331c. The gate conductive layer 331b is disposed on the gate barrier layer 331a. The gate copper nitride layer 331c is disposed on an upper surface and a side surface of the gate conductive layer 331b. The gate line 331 is connected to a gate electrode (not shown) of the switching transistor.

A gate electrode 318 of the driving transistor 355 is formed on substantially the same layer as the gate line 331. The gate electrode 318 is connected to a drain electrode (not shown) of the switching transistor. The gate electrode 318 includes a gate barrier pattern 318a, a gate conductive pattern 318b, and a gate copper nitride pattern 318c. The gate copper nitride pattern 318c is disposed on an upper surface and a side surface of the gate conductive pattern 318b.

The gate insulating layer 326 is disposed on the insulating substrate 320 on which the black matrix 302, the gate line 331, and the gate electrode 318 are formed. In FIG. 29, the gate insulating layer 326 includes a first gate insulating layer made of low density silicon nitride, a second gate insulating layer made of high density silicon nitride, and a third gate insulating layer made of low density silicon nitride.

A semiconductor pattern 337 of the driving transistor 355 is disposed on the gate insulating layer 326 corresponding to the gate electrode 318. The semiconductor pattern 337 includes an amorphous silicon pattern 337a and an n+ amorphous silicon pattern 337b.

The driving voltage line 333 is disposed on the gate insulating layer 326. The driving voltage line 333 includes a driving voltage barrier layer 333a, a driving voltage conductive layer 333b, and a driving voltage copper nitride layer 333c. The driving voltage conductive layer 333b is disposed on the driving voltage barrier layer 333a and the driving voltage copper nitride layer 333c is disposed on an upper surface and a side surface of the driving voltage conductive layer 333b.

A source electrode 317 of the driving transistor 355 is disposed on the semiconductor pattern 337. The source electrode 317 is electrically connected to the driving voltage line 333. The source electrode 317 includes a source barrier pattern 317a, a source conductive pattern 317b, and a source copper nitride pattern 317c. The source copper nitride pattern 317c is disposed on an upper surface and a side surface of the source conductive pattern 317b.

A drain electrode 319 of the driving transistor 355 is spaced apart from the source electrode 317 on the semiconductor pattern 337. The drain electrode 319 includes a drain barrier pattern 319a, a drain conductive pattern 319b, and a drain copper nitride pattern 319c. The drain copper nitride pattern 319c is disposed on an upper surface and a side surface of the drain conductive pattern 319b.

The passivation layer 316 is disposed on the gate insulating layer 326 to cover the driving transistor 355, the switching transistor, and the driving voltage line 333.

The color filter 304 is disposed on the passivation layer 316 to transmit colored light having a wavelength corresponding to the color. Alternatively, an overcoating layer (not shown) may be formed on the color filter 304. The passivation layer 316 and the color filter 304 have a contact hole 351 through which the drain electrode 319 of the driving transistor 355 is partially exposed.

The pixel electrode 312 is disposed on the color filter 304, and is connected to the drain electrode 319 of the driving transistor 355 through the contact hole 351. The pixel electrode 312 may include a transparent conductive material.

The organic light emitting layer 308 is formed on the color filter 304 to cover the pixel electrode 312.

The opposite electrode 306 is disposed on the organic light emitting layer 308 and may include metal.

The protecting layer 305 is formed on the opposite electrode 306 to protect the opposite electrode 306.

When a current flows through the organic light emitting layer 308 between the pixel electrode 312 and the opposite electrode 306, the organic light emitting layer 308 generates light. The light generated from the organic light emitting layer 308 passes through the color filter 304, thereby displaying an image.

Accordingly, in the display device of FIG. 29, the resistance of the gate line 331, the driving voltage line 333, and the data line (not shown) may be decreased, which may improve the image display quality of the display device. In addition, the etching resistance of the source electrode 317 and the drain electrode 319 may be increased by the copper nitride patterns 317c and 319c that are formed on the side surfaces of the source and drain electrodes 317 and 319, which may decrease the occurrence of defects in the display device.

According to the present invention, the copper nitride patterns are formed on the upper surface and the side surface of the conductive patterns so that an additional protecting layer for protecting the copper lines may be omitted. Thus, the manufacturing time and the manufacturing cost of the array substrate may be decreased.

In addition, the copper nitride pattern formed through a sputtering process has substantially the same etching rate as the conductive pattern, which may improve the etching profile of the conductive patterns of the array substrate.

Furthermore, the copper nitride pattern formed through the nitride plasma process covers the side surface of the conductive patterns to protect the conductive patterns during the etching process for etching the n+amorphous silicon pattern.

Also, since the resistance of the conductive patterns may be decreased, the image display quality of the display device may be improved.

The gate insulating layer may also have a multi-layered structure to improve the electrical characteristics of the semiconductor pattern.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An array substrate, comprising:
    a switching element on an insulating substrate;
    a signal transmission line connected to the switching element, the signal transmission line comprising:
        a barrier layer on the insulating substrate;
        a conductive line on the barrier layer, the conductive line comprising copper or copper alloy; and
        a copper nitride layer covering the conductive line;
    a passivation layer covering the switching element and the signal transmission line, the passivation layer comprising a contact hole through which a drain electrode of the switching element is partially exposed; and
    a pixel electrode on the insulating substrate, the pixel electrode being connected to the drain electrode of the switching element through the contact hole.

2. The array substrate of claim 1, wherein the copper nitride layer covers an upper surface of the conductive line.

3. The array substrate of claim 1, wherein the copper nitride layer covers an upper surface and a side surface of the conductive line.

4. The array substrate of claim 1, wherein the switching element further comprises:
    a gate electrode on the insulating substrate;
    a gate insulating layer on the gate electrode;
    a semiconductor pattern on the gate insulating layer to be connected to the drain electrode; and
    a source electrode spaced apart from the drain electrode on the semiconductor pattern.

5. The array substrate of claim 4, wherein the signal transmission line is connected to the gate electrode.

6. The array substrate of claim 4, wherein the signal transmission line is connected to the source electrode.

7. The array substrate of claim 4, wherein the source electrode comprises:
    a source barrier pattern on the semiconductor pattern;
    a source conductive pattern on the source barrier pattern, the source conductive pattern comprising copper or copper alloy; and
    a source copper nitride pattern covering an upper surface and a side surface of the source conductive pattern.

8. The array substrate of claim 7, wherein the drain electrode comprises:
    a drain barrier pattern on the semiconductor pattern;
    a drain conductive pattern on the drain barrier pattern, the drain conductive pattern including copper or copper alloy; and
    a drain copper nitride pattern covering an upper surface and a side surface of the drain conductive pattern.

9. The array substrate of claim 1, wherein the switching element comprises:
    a source electrode spaced apart from the drain electrode on the insulating substrate;
    a semiconductor pattern interposed between the source electrode and the drain electrode;
    a gate insulating layer covering the source electrode, the drain electrode, and the semiconductor pattern; and
    a gate electrode on the gate insulating layer, the gate electrode corresponding to the semiconductor pattern.

10. The array substrate of claim 1, further comprising:
    a driving element interposed between the drain electrode of the switching element and the pixel electrode to apply a driving signal to the pixel electrode;
    an organic light emitting layer on the pixel electrode; and
    an opposite electrode on the organic light emitting layer.

11. A display device, comprising:
    a switching element on an insulating substrate;
    a signal transmitting line connected to the switching element, the signal transmitting line comprising:
        a barrier layer on the insulating substrate;
        a conductive line on the barrier layer, the conductive line comprising copper or copper alloy; and
        a copper nitride layer covering the conductive line;
    a pixel electrode on the insulating substrate, the pixel electrode being connected to a drain electrode of the switching element;
    a passivation layer covering the switching element and the signal transmission line;
    a liquid crystal layer on the passivation layer;
    an opposite electrode on the liquid crystal layer, the opposite electrode facing the pixel electrode; and
    an opposite insulating substrate on the opposite electrode, the opposite insulating substrate facing the insulating substrate.

* * * * *